(12) United States Patent
Tanimoto

(10) Patent No.: US 10,756,057 B2
(45) Date of Patent: *Aug. 25, 2020

(54) HALF-BRIDGE POWER SEMICONDUCTOR MODULE AND METHOD OF MANUFACTURING SAME

(71) Applicant: NISSAN MOTOR CO., LTD., Yokohama-shi, Kanagawa-ken (JP)

(72) Inventor: Satoshi Tanimoto, Kanagawa (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/527,143

(22) PCT Filed: Nov. 28, 2014

(86) PCT No.: PCT/JP2014/081609
§ 371 (c)(1),
(2) Date: May 16, 2017

(87) PCT Pub. No.: WO2016/084241
PCT Pub. Date: Jun. 2, 2016

(65) Prior Publication Data
US 2017/0345792 A1    Nov. 30, 2017

(51) Int. Cl.
*H01L 25/065* (2006.01)
*H01L 25/18* (2006.01)
(Continued)

(52) U.S. Cl.
CPC .......... *H01L 25/0655* (2013.01); *H01L 23/48* (2013.01); *H01L 23/49838* (2013.01);
(Continued)

(58) Field of Classification Search
CPC ........... H01L 25/0655; H01L 23/49811; H01L 23/49838; H01L 23/48; H01L 25/07;
(Continued)

(56) References Cited

U.S. PATENT DOCUMENTS 4,819,042 A    4/1989    Kaufman
5,347,158 A    9/1994    Matsuda et al.
(Continued)

FOREIGN PATENT DOCUMENTS

CN    102067309 A    5/2011
CN    102195458 A    9/2011
(Continued)

OTHER PUBLICATIONS

USPTO Office Action, U.S. Appl. No. 15/322,765, dated May 21, 2018, 16 pages.
(Continued)

*Primary Examiner* — Bitew A Dinke
(74) *Attorney, Agent, or Firm* — Foley & Lardner LLP

(57) ABSTRACT

A half-bridge power semiconductor module includes an insulating wiring board including a positive-electrode wiring conductor, a bridge wiring conductor, and a negative-electrode wiring conductor arranged on or above a single insulating plate in such a way as to be electrically insulated from each other. The back-surface electrodes of a high-side power semiconductor device and a low-side power semiconductor device are joined to the front sides of the positive-electrode wiring conductor and the bridge wiring conductor. Front-surface electrodes of the high-side power semiconductor device and the low-side power semiconductor device are connected to the bridge wiring conductor and the negative-electrode wiring conductor by a plurality of bonding wires and a plurality of bonding wires.

22 Claims, 25 Drawing Sheets

(51) Int. Cl.
  *H01L 23/48* (2006.01)
  *H02M 7/48* (2007.01)
  *H01L 25/07* (2006.01)
  *H01L 23/00* (2006.01)
  *H02M 3/155* (2006.01)
  *H02M 7/04* (2006.01)
  *H01L 23/498* (2006.01)
  *H02M 7/00* (2006.01)
  *H03K 17/567* (2006.01)

(52) U.S. Cl.
  CPC ........ *H01L 23/49844* (2013.01); *H01L 24/48* (2013.01); *H01L 24/49* (2013.01); *H01L 25/072* (2013.01); *H01L 25/18* (2013.01); *H02M 3/155* (2013.01); *H02M 7/003* (2013.01); *H02M 7/04* (2013.01); *H02M 7/48* (2013.01); *H03K 17/567* (2013.01); *H01L 23/49811* (2013.01); *H01L 2224/05552* (2013.01); *H01L 2224/05554* (2013.01); *H01L 2224/0603* (2013.01); *H01L 2224/45014* (2013.01); *H01L 2224/4809* (2013.01); *H01L 2224/48091* (2013.01); *H01L 2224/48139* (2013.01); *H01L 2224/48472* (2013.01); *H01L 2224/49111* (2013.01); *H01L 2224/49113* (2013.01); *H01L 2224/49175* (2013.01); *H01L 2224/49431* (2013.01); *H01L 2924/0002* (2013.01); *H01L 2924/00014* (2013.01); *H01L 2924/13055* (2013.01); *H01L 2924/13091* (2013.01); *H01L 2924/19105* (2013.01)

(58) Field of Classification Search
  CPC ......... H01L 25/18; H01L 24/48; H01L 24/49; H01L 25/072; H01L 23/5383; H03K 17/567; H02M 7/003; H02M 1/00
  See application file for complete search history.

(56) References Cited

U.S. PATENT DOCUMENTS

| | | | |
|---|---|---|---|
| 6,212,087 B1 * | 4/2001 | Grant .................... | H02M 7/003 361/707 |
| 6,343,023 B1 | 1/2002 | Wunderlich | |
| 7,468,560 B2 | 12/2008 | Guengerich et al. | |
| 7,505,294 B2 * | 3/2009 | Ahmed ................ | H02M 7/003 363/132 |
| 8,461,623 B2 | 6/2013 | Nakata | |
| 8,526,199 B2 | 9/2013 | Matsumoto et al. | |
| 9,000,601 B2 | 4/2015 | Azuma et al. | |
| 9,106,124 B2 | 8/2015 | Bayerer et al. | |
| 10,396,057 B2 * | 8/2019 | Tanimoto ................ | H01L 24/40 |
| 2002/0047132 A1 | 4/2002 | Fukada et al. | |
| 2002/0186545 A1 | 12/2002 | Fukada et al. | |
| 2004/0113268 A1 * | 6/2004 | Shirakawa .......... | H01L 23/5383 257/724 |
| 2004/0227231 A1 * | 11/2004 | Maly .................... | H01L 25/072 257/724 |
| 2004/0228094 A1 * | 11/2004 | Ahmed ................ | H01L 25/072 361/702 |
| 2005/0024805 A1 * | 2/2005 | Heilbronner ............ | H01L 24/49 361/100 |
| 2006/0244116 A1 | 11/2006 | Tsunoda | |
| 2007/0076355 A1 * | 4/2007 | Oohama ................ | H01L 25/117 361/676 |
| 2007/0228413 A1 | 10/2007 | Bayerer et al. | |
| 2009/0015185 A1 * | 1/2009 | Yoshida ................ | B60K 6/26 318/504 |
| 2009/0016088 A1 * | 1/2009 | Bayerer ................ | H01L 24/24 363/125 |
| 2009/0039498 A1 * | 2/2009 | Bayerer ................ | C04B 37/021 257/700 |
| 2009/0085219 A1 * | 4/2009 | Bayerer ................ | H01L 24/48 257/776 |
| 2009/0091892 A1 * | 4/2009 | Otsuka ................ | H02M 7/003 361/715 |
| 2010/0013085 A1 * | 1/2010 | Oi ........................ | H01L 23/3121 257/693 |
| 2010/0065962 A1 * | 3/2010 | Bayerer .............. | H01L 23/3735 257/703 |
| 2010/0127371 A1 * | 5/2010 | Tschirbs ................ | H01L 23/13 257/684 |
| 2011/0062491 A1 * | 3/2011 | Nakata ................ | H01L 25/072 257/146 |
| 2011/0101515 A1 * | 5/2011 | Beaupre ................ | H01L 24/49 257/691 |
| 2011/0216561 A1 | 9/2011 | Bayerer et al. | |
| 2011/0273861 A1 | 11/2011 | Matsumoto et al. | |
| 2012/0106220 A1 | 5/2012 | Yamaguchi et al. | |
| 2013/0001805 A1 * | 1/2013 | Azuma ................ | H01L 25/072 257/784 |
| 2013/0043593 A1 * | 2/2013 | Domes ................ | H01L 23/3735 257/758 |
| 2013/0258628 A1 * | 10/2013 | Kawanami ............ | H01L 25/072 361/783 |
| 2013/0285231 A1 | 10/2013 | Kodaira | |
| 2013/0286618 A1 * | 10/2013 | Shibasaki ............. | H01L 23/049 361/772 |
| 2014/0159225 A1 * | 6/2014 | Zushi .................. | H01L 23/3735 257/690 |
| 2014/0167235 A1 | 6/2014 | Horie | |
| 2014/0346659 A1 | 11/2014 | Nakamura et al. | |
| 2014/0346676 A1 * | 11/2014 | Horio ...................... | H01L 25/18 257/773 |
| 2014/0361424 A1 | 12/2014 | Horio et al. | |
| 2014/0367736 A1 * | 12/2014 | Iizuka ................ | H01L 25/072 257/133 |
| 2015/0023081 A1 * | 1/2015 | Obiraki ................ | H02M 7/003 363/131 |
| 2015/0137344 A1 * | 5/2015 | Mori .................... | H01L 25/072 257/712 |
| 2015/0194372 A1 * | 7/2015 | Ikeuchi ................ | H01L 23/645 257/675 |
| 2015/0287665 A1 * | 10/2015 | Hanada ................ | H01L 25/115 257/691 |
| 2016/0094150 A1 * | 3/2016 | Domurat-Linde .... | H01L 25/072 318/503 |
| 2016/0148859 A1 * | 5/2016 | Muto ................ | H01L 23/49537 257/676 |
| 2016/0344301 A1 | 11/2016 | Maruyama et al. | |
| 2016/0351505 A1 * | 12/2016 | Tamada ................ | H01L 25/07 |
| 2016/0358895 A1 | 12/2016 | Nakashima et al. | |
| 2017/0077068 A1 * | 3/2017 | Horio ................ | H01L 23/3735 |
| 2017/0154877 A1 * | 6/2017 | Tanimoto ............. | H01L 25/072 |
| 2017/0294373 A1 | 10/2017 | Rowden et al. | |
| 2017/0345792 A1 | 11/2017 | Tanimoto | |

FOREIGN PATENT DOCUMENTS

| | | | | |
|---|---|---|---|---|
| CN | 102856308 A | | 1/2013 | |
| EP | 0 621 635 A1 | | 10/1994 | |
| EP | 0621635 A1 | * | 10/1994 | ............ H01L 24/49 |
| JP | 7-38013 A | | 2/1995 | |
| JP | 7-022553 U | | 4/1995 | |
| JP | 2001-102519 A | | 4/2001 | |
| JP | 2002-33446 A | | 1/2002 | |
| JP | 2002-076256 A | | 3/2002 | |
| JP | 2002-112559 A | | 4/2002 | |
| JP | 2002-112559 A | | 4/2002 | |
| JP | 2002-373971 A | | 12/2002 | |
| JP | 2002-373971 A | | 12/2002 | |
| JP | 2002373971 A | * | 12/2002 | |
| JP | 2005192328 A | * | 7/2005 | |
| JP | 2006-86438 A | | 3/2006 | |
| JP | 2006-313821 A | | 11/2006 | |
| JP | 2008-091809 A | | 4/2008 | |
| JP | 2008-306872 A | | 12/2008 | |
| JP | 2008-306872 A | | 12/2008 | |
| JP | 2009-71962 A | | 4/2009 | |

(56) References Cited

FOREIGN PATENT DOCUMENTS

| JP | 2009-159707 A | 7/2009 | | |
|----|---------------|--------|---|---|
| JP | 2010-205960 A | 9/2010 | | |
| JP | 2011-238691 A | 11/2011 | | |
| JP | WO 2012073570 A1 * | 6/2012 | ........... | H01L 25/072 |
| JP | 2013-033812 A | 2/2013 | | |
| JP | 2013-89784 A | 5/2013 | | |
| JP | 2013-219290 A | 10/2013 | | |
| JP | 2014-038982 A | 2/2014 | | |
| JP | WO 2014091608 A1 * | 6/2014 | ........... | H01L 23/427 |
| JP | WO 2016129097 A1 * | 8/2016 | | |
| WO | WO 2014/091608 A1 | 6/2014 | | |
| WO | WO 2014/0916908 A1 | 6/2014 | | |

OTHER PUBLICATIONS

USPTO Office Action, U.S. Appl. No. 15/322,765, dated Mar. 20, 2019, 17 pages.
USPTO Office Action, U.S. Appl. No. 15/322,765, dated Nov. 1, 2018, 15 pages.
USPTO Notice of Allowance, U.S. Appl. No. 15/322,765, dated Aug. 21, 2019, 12 pages.
Machine Translation, Kuno, Japanese Pat. Pub. No. JP 2005-192328, translation date Mar. 13, 2020, espacenet, all pages.

\* cited by examiner (a)

(b)

(c)

(a)

(b)

(a)

(b)

(a)

(b)

(c)

(a)

(b)

(c)

(a)

(b)

(a)

(b)

(c)

(a)

(b)

(c)

(a)

(b)

(c)

(a)

(b)

(c)

(a)

(b)

(a)

(b)

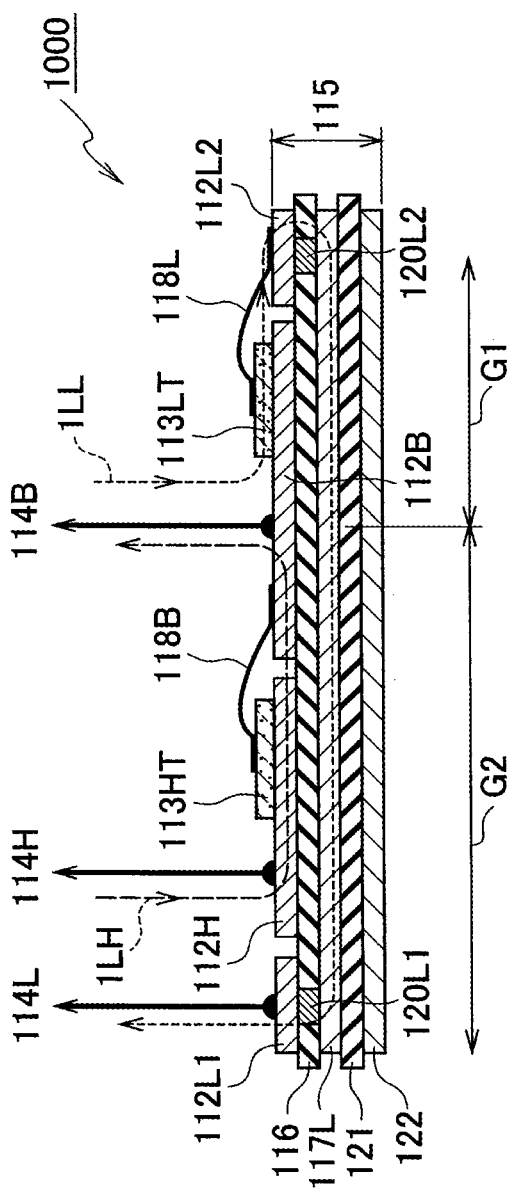

HALF-BRIDGE POWER SEMICONDUCTOR MODULE AND METHOD OF MANUFACTURING SAME

TECHNICAL FIELD

The present invention relates to a half-bridge power semiconductor module capable of significantly reducing parasitic inductances generated in paths for principal currents without increasing thermal resistance, and a method of manufacturing the same.

BACKGROUND ART

Power modules have been known which are obtained by housing, within a single package, a half-bridge circuit including two power semiconductor device chips connected in series and an output terminal set at a middle point on their connection (see Patent Literatures 1 and 2). In Patent Literatures 1 and 2, the direction of a principal current which flows through a conductor on the front surface of an insulating plate and the direction of a principal current which flows through a conductor on the back surface of the insulating plate are set opposite to each other. In this way, "close and parallel counterflows" are generated, thus reducing the parasitic inductance in the power module.

CITATION LIST

Patent Literatures

Patent Literature 1: Japanese Patent Application Publication No. 2002-112559
Patent Literature 2: Japanese Patent Application Publication No. 2002-373971

SUMMARY OF INVENTION

Here, the power modules of Patent Literatures 1 and 2 dissipate heat generated inside the modules from the back-surface side of the insulating plate, and therefore another insulating board is provided on the back-surface side of the back-surface conductor. This has led to a problem that the thermal resistance of the power module is increased.

The present invention has been made in view of the above problem, and an object thereof is to provide a half-bridge power semiconductor module capable of reducing parasitic inductances generated in paths for principal currents without increasing the thermal resistance, and a method of manufacturing the same.

A half-bridge power semiconductor module according to one aspect of the present invention includes an insulating wiring board including a positive-electrode wiring conductor, a bridge wiring conductor, and a negative-electrode wiring conductor arranged on or above a single insulating plate in such a way as to be electrically insulated from each other. The back-surface electrodes of a high-side power semiconductor device and a low-side power semiconductor device are joined to the front sides of the positive-electrode wiring conductor and the bridge wiring conductor. Front-surface electrodes of the high-side power semiconductor device and the low-side power semiconductor device are connected to the bridge wiring conductor and the negative-electrode wiring conductor by high-side connection means and low-side connection means.

BRIEF DESCRIPTION OF DRAWINGS

FIG. 21 is a cross-sectional view illustrating the structure of a half-bridge power module 1000 according to a comparative example.

DESCRIPTION OF EMBODIMENTS

Hereinbelow, embodiments and their modifications will be described with reference to the drawings. It is to be noted that the configurations of half-bridge power semiconductor modules will be schematically described below and, in these schematic drawings, the relation between the thickness and the dimensions in plan views, the proportions of the thicknesses of layers, and the like are depicted with exaggeration to facilitate understanding. The same member will be denoted by the same reference sign, and description thereof will not be repeated.

First Embodiment

Figure 1:
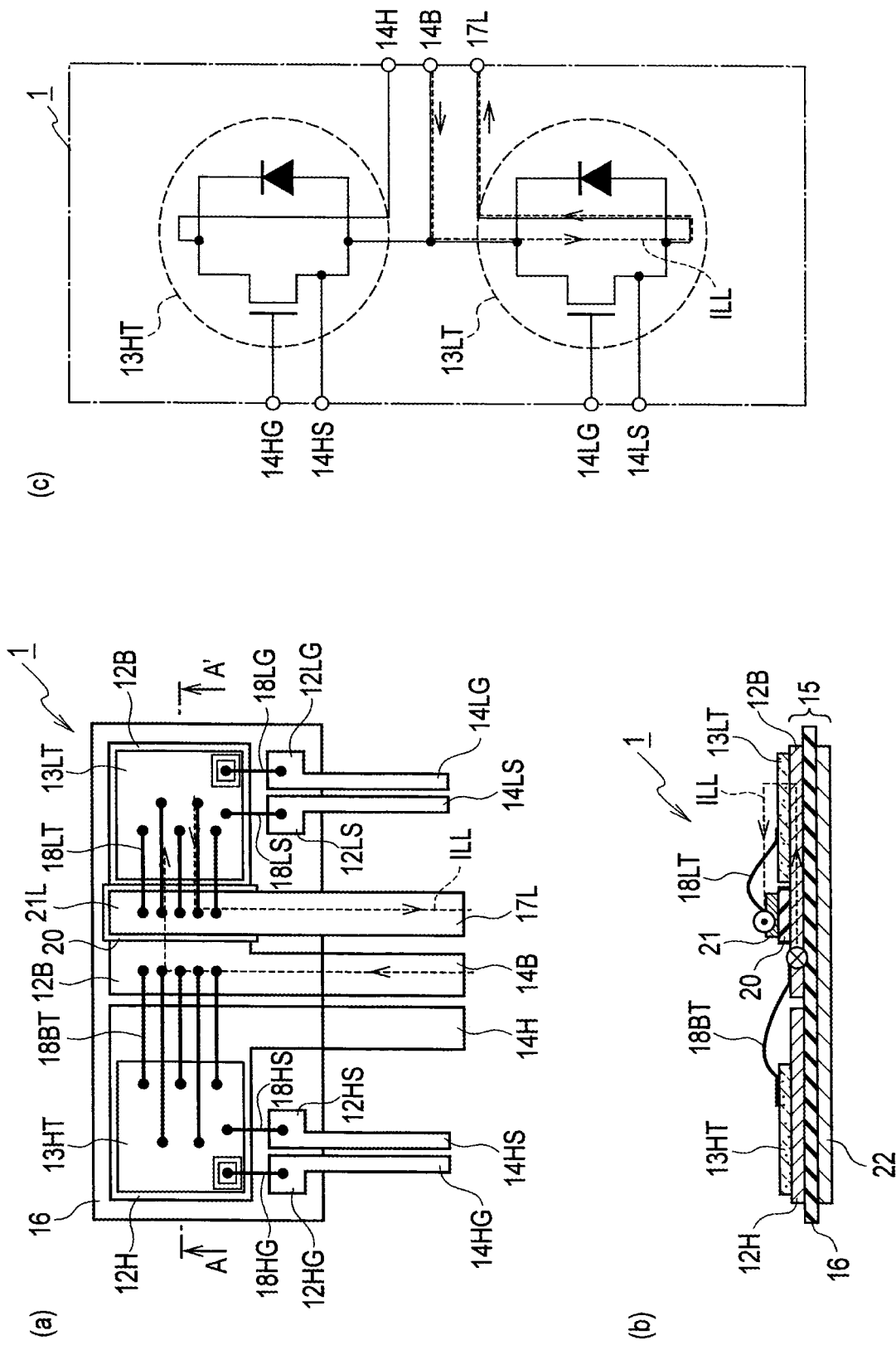
FIG. 1 Part (a) of FIG. 1 is a plan view illustrating the structure of a half-bridge power semiconductor module 1 according to a first embodiment, part (b) of FIG. 1 is a crosssectional view taken along cross-sectional plane A-A' in part (a) of FIG. 1, and part (c) of FIG. 1 is a circuit diagram of the half-bridge power semiconductor module 1.

The structure of a half-bridge power semiconductor module 1 according to a first embodiment will be described with reference to part (a) to part (c) of FIG. 1. Part (a) of FIG. 1 is a plan view, and part (b) of FIG. 1 is a cross-sectional view taken along cross-sectional plane A-A' in part (a) of FIG. 1. Part (c) of FIG. 1 is a circuit diagram of the half-bridge power semiconductor module 1. In part (b) of FIG. 1, the flow of a principal current (load current) ILL which flows while a low-side power semiconductor device 13LT formed of a power switching element is turned on is illustrated by a broken line and arrows.

The half-bridge power semiconductor module 1 includes an insulating wiring board 15 having a laminate structure, a high-side power semiconductor device (switch) 13HT and a low-side power semiconductor device (switch) 13LT arranged on the front surface of the insulating wiring board 15 in such a way as to be electrically insulated from each other, a bridge terminal 14B, a high-side terminal 14H, a low-side terminal 17L, a plurality of bonding wires 18BT as an example of high-side connection means, and a plurality of bonding wires 18LT as an example of low-side connection means.

Note that, besides bonding wires, bonding ribbons or clip leads can be used as the high-side connection means and the low-side connection means. Here, in view of reducing electrical resistance and parasitic inductance as much as possible, the bonding wires 18BT and 18LT are optimized by increasing the numbers, cross-sectional areas, and surface areas of the bonding wires 18BT and 18LT and lowering the ground level thereof as much as possible as long as constraints on processing, mechanical strength, and long-term fatigue resistance are not deteriorated.

[Insulating Wiring Board 15]

The insulating wiring board 15 includes a single insulating plate 16 and a plurality of wiring conductors (12H, 12B, 21L, 12HG, 12HS, 12LG, 12LS) arranged on or above the front surface of the insulating plate 16 in such a way as to be electrically insulated from each other. The plurality of wiring conductors are a positive-electrode wiring conductor 12H, a bridge wiring conductor 12B, a negative-electrode wiring conductor 21L, gate-signal wiring conductors (12HG, 12LG), and source-signal wiring conductors (12HS, 12LS).

The positive-electrode wiring conductor 12H, the bridge wiring conductor 12B, the gate-signal wiring conductors (12HG, 12LG), and the source-signal wiring conductors (12HS, 12LS) are directly joined to the front surface of the insulating plate 16. The negative-electrode wiring conductor 21L is joined to the front side of the bridge wiring conductor 12B with an insulating chip 20 interposed therebetween. The negative-electrode wiring conductor 21L is electrically insulated from the bridge wiring conductor 12B by the insulating chip 20.

The insulating plate 16 is formed of, for example, a plate of a ceramic such as silicon nitride (SiN), aluminum nitride (AlN), or alumina, or a resin sheet with insulation strength attached to a base plate. In view of reducing the thermal resistance of the insulating plate 16 as much as possible, the thickness of the insulating plate 16 is desirably set to the minimum thickness that satisfies the insulation strength, the mechanical strength, and the long-term fatigue resistance. For example, the thickness of the insulating plate 16 is in the range of 0.2 to 1.5 mm in a case where it is required to withstand an instantaneous voltage of 1.2 kV. Specifically, in the case where the insulating plate 16 is an SiN plate, it can be as thin as 0.31 mm, with the mechanical strength taken into consideration. The insulating chip 20 is similar to the insulating plate 16.

Desirably, each of the plurality of wiring conductors (12H, 12B, 21L, 12HG, 12HS, 12LG, 12LS) has a flat plate shape and is formed of, for example, a plate of a metal such as Cu or Al, and its surface is plated with Ni to be resistant to oxidation. The bridge terminal 14B, the high-side terminal 14H, and the low-side terminal 17L are similar to the plurality of wiring conductors (12H, 12B, 21L, 12HG, 12HS, 12LG, 12LS).

The insulating wiring board 15 may further include a thermal-strain alleviation conductor 22 directly attached to the back surface of the insulating plate 16, in view of preventing warpage of the board by thermal stress.

[High-Side Power Semiconductor Device (Switch) 13HT and Low-Side Power Semiconductor Device (Switch) 13LT]

In the first embodiment, as illustrated in part (c) of FIG. 1, each of the high-side power semiconductor device 13HT and the low-side power semiconductor device 13LT is a unipolar power switching element incorporating a reverse conducting diode, e.g., a MOSFET, a junction FET, or the like. Each of the high-side power semiconductor device 13HT and the low-side power semiconductor device 13LT includes a gate electrode into which to input a control signal (gate signal) for switching between a state where conduction is allowed between its front-surface electrode and back-surface electrode (ON state) and a state where the conduction is shut off (OFF state).

The high-side power semiconductor device 13HT has its back-surface electrode joined to the front side of the positive-electrode wiring conductor 12H. Specifically, the front-surface electrode (source or emitter electrode) is formed on the front surface of the high-side power semiconductor device 13HT, and the back-surface electrode (drain or collector electrode) is formed on the back surface thereof. The back-surface electrode of the high-side power semiconductor device 13HT has an ohmic connection to (hereinafter, simply expressed as "is connected to") the positive-electrode wiring conductor 12H by solder or the like. The front-surface electrode of the high-side power semiconductor device 13HT is connected to the bridge wiring conductor 12B by the plurality of bonding wires 18BT.

The portions of the plurality of bonding wires 18BT and the bridge wiring conductor 12B connected to each other are situated between the high-side power semiconductor device 13HT and the low-side power semiconductor device 13LT. Specifically, like the A-A' cross section illustrated in part (b) of FIG. 1, the connected portions are situated between the high-side power semiconductor device 13HT and the low-side power semiconductor device 13LT in cross-sectional planes extending through both of the semiconductor devices (13HT, 13LT).

The low-side power semiconductor device 13LT has its back-surface electrode joined to the front side of the bridge wiring conductor 12B. Specifically, the front-surface electrode (source or emitter electrode) is formed on the front surface of the low-side power semiconductor device 13LT, and the back-surface electrode (drain or collector electrode) is formed on the back surface thereof. The back-surface electrode of the low-side power semiconductor device 13LT is connected to one side (right side) of the bridge wiring conductor 12B by solder or the like. The "one side of the bridge wiring conductor 12B" refers to the far side thereof from the high-side power semiconductor device 13HT. The front-surface electrode of the low-side power semiconductor device 13LT is connected to the negative-electrode wiring conductor 21L by the plurality of bonding wires 18LT.

The portions the plurality of bonding wires 18LT and the negative-electrode wiring conductor 21L connected to each other are situated between the high-side power semiconductor device 13HT and the low-side power semiconductor device 13LT. Specifically, like the A-A' cross section illustrated in part (b) of FIG. 1, the connected portions are situated between the high-side power semiconductor device 13HT and the low-side power semiconductor device 13LT in cross-sectional planes extending through both of the semiconductor devices (13HT, 13LT).

The half-bridge power semiconductor module 1 further includes bonding wires (18HG, 18LG) as gate-signal connection means for connecting the gate electrodes of the semiconductor devices (13HT, 13LT) and the gate-signal wiring conductors (12HG, 12LG), and bonding wires (18HS, 18LS) as source-signal connection means for connecting the source electrodes of the semiconductor devices (13HT, 13LT) and the source-signal wiring conductors (12HS, 12LS). Note that, besides bonding wires, bonding ribbons or clip leads can be used as the gate-signal connection means and the source-signal connection means.

[Bridge Terminal 14B, High-Side Terminal 14H, and Low-Side Terminal 17L]

The bridge terminal 14B is connected to the bridge wiring conductor 12B at a position between the high-side power semiconductor device 13HT and the low-side power semiconductor device 13LT. The high-side terminal 14H is connected to the positive-electrode wiring conductor 12H at a position between the high-side power semiconductor device 13HT and the low-side power semiconductor device 13LT. The low-side terminal 17L is connected to the negative-electrode wiring conductor 21L at a position between the high-side power semiconductor device 13HT and the low-side power semiconductor device 13LT.

In the first embodiment, the high-side terminal 14H, the bridge terminal 14B, and the low-side terminal 17L are part of the positive-electrode wiring conductor 12H, part of the bridge wiring conductor 12B, and part of the negative-electrode wiring conductor 21L extended in a direction parallel to the main surface of the insulating plate 16, respectively. That is, the high-side terminal 14H and the positive-electrode wiring conductor 12H, the bridge terminal 14B and the bridge wiring conductor 12B, and the low-side terminal 17L and the negative-electrode wiring conductor 21L are formed integrally with each other. The high-side terminal 14H, the bridge terminal 14B, and the low-side terminal 17L are each extended to the outside of the insulating plate 16 as viewed from a direction normal to the main surface of the insulating plate 16.

The half-bridge power semiconductor module 1 further includes gate-signal terminals (14HG, 14LG) connected to the gate-signal wiring conductors (12HG, 12LG) and source-signal terminals (14HS, 14LS) connected to the source-signal wiring conductors (12HS, 12LS). The gate-signal terminals (14HG, 14LG) and the source-signal terminals (14HS, 14LS) are part of the gate-signal wiring conductors (12HG, 12LG) and part of the source-signal wiring conductors (12HS, 12LS) extended in a direction parallel to the main surface of the insulating plate 16, respectively. In the view from the direction normal to the main surface of the insulating plate 16, the gate-signal terminals (14HG, 14LG) and the source-signal terminals (14HS, 14LS) are extended to the outside of the insulating plate 16.

The bridge terminal 14B, the high-side terminal 14H, and the low-side terminal 17L are arranged close and parallel to each other. Similarly, the gate-signal terminal 14HG and the source-signal terminal 14HS are arranged close and parallel to each other, and the gate-signal terminal 14LG and the source-signal terminal 14LS are arranged close and parallel to each other. The direction in which each terminal (14B, 14H, 17L) is extended is perpendicular to the direction in which the plurality of bonding wires (18BT, 18LT) are extended.

The high-side terminal 14H and the bridge terminal 14B, and the bridge terminal 14B and the low-side terminal 17L can be arranged as close as possible in distance to each other as far as the design rules for electric discharge prevention and manufacturing method allow. An insulating material (not illustrated) is desirably sandwiched between the high-side terminal 14H and the bridge terminal 14B and between the bridge terminal 14B and the low-side terminal 17L in view of preventing electric discharge and preventing contact.

In this embodiment, the high-side power semiconductor device 13HT and the low-side power semiconductor device 13LT are expected to be controlled to be exclusively turned on. However, the high-side power semiconductor device 13HT and the low-side power semiconductor device 13LT can be simultaneously turned on (grounded).

[Method of Manufacturing Half-Bridge Power Semiconductor Module 1]

Next, an example of the method of manufacturing the half-bridge power semiconductor module 1 in FIG. 1 will be described with reference to part (a) to part (e) of FIG. 2.

Figure 2:
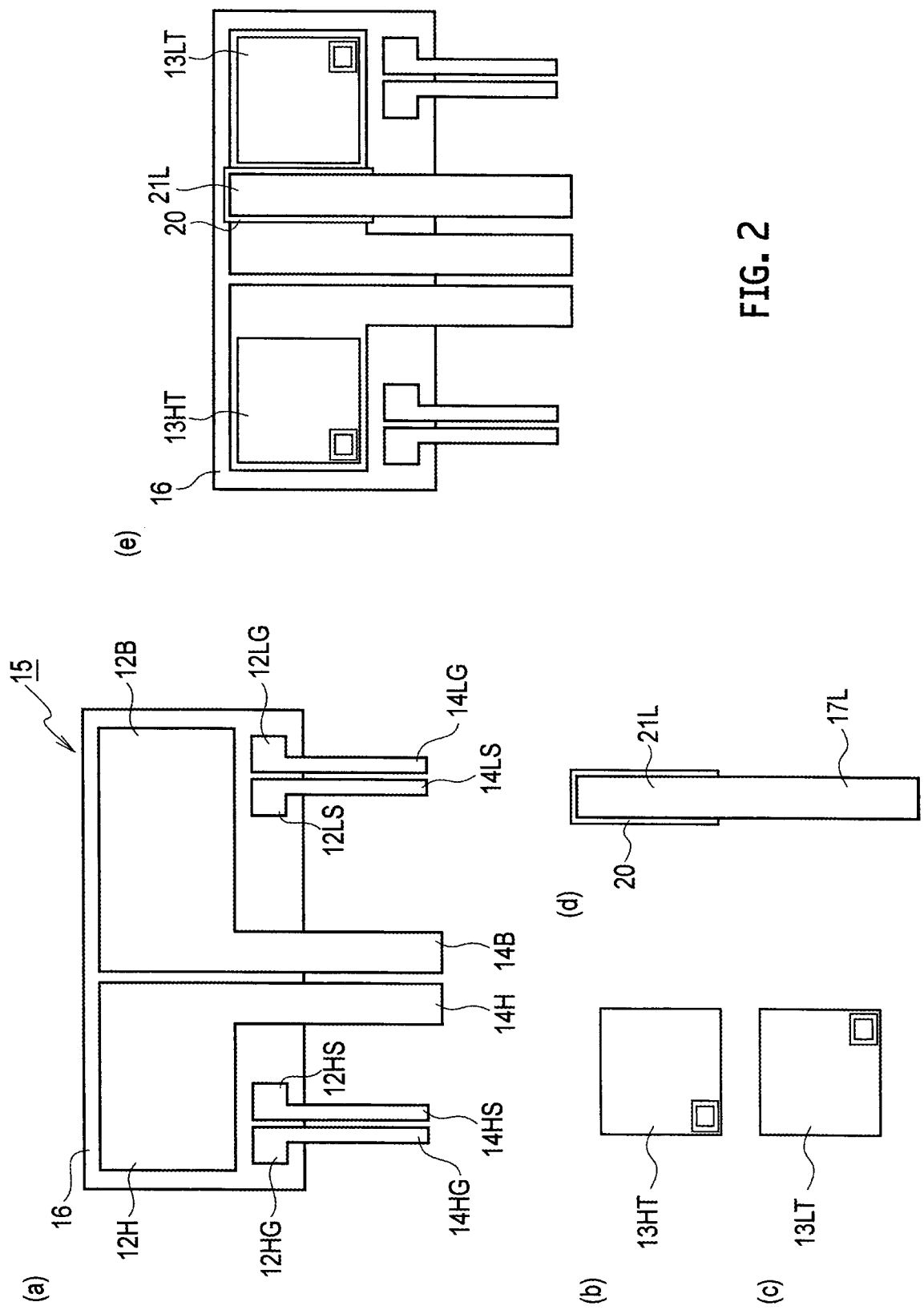
FIG. 2 Part (a) to part (d) of FIG. 2 are plan views illustrating the first step in a method of manufacturing the half-bridge power semiconductor module 1 in FIG. 1, and part (e) of FIG. 2 is a plan view illustrating the second step in the method of manufacturing the half-bridge power semiconductor module 1 in FIG. 1.

In the first step are prepared an insulating wiring board illustrated in part (a) of FIG. 2, the high-side power semiconductor device 13HT illustrated in part (b) of FIG. 2, the low-side power semiconductor device 13LT illustrated in part (c) of FIG. 2, and the insulating chip 20 with the negative-electrode wiring conductor 21L joined thereto illustrated in part (d) of FIG. 2. The insulating wiring board illustrated in part (a) of FIG. 2 has the positive-electrode wiring conductor 12H, the bridge wiring conductor 12B, the gate-signal wiring conductors (12HG, 12LG), and the source-signal wiring conductors (12HS, 12LS) joined to the front surface of the insulating plate 16. Note that part of each wiring conductor (12H, 12B, 12HG, 12LG, 12HS, 12LS, 21L) is extended as a terminal (14H, 14B, 14HG, 14LG, 14HS, 14LS, 17L) to the outside of the insulating plate 16.

The insulating wiring board is thoroughly washed at least on its front surface with an organic solvent such as acetone or ethanol. The back surfaces of the power semiconductor devices (13HT, 13LT) and the back surface of the insulating chip 20 have undergone a metallization that allows soldering. Meanwhile, today, the above insulating wiring board and the insulating chip 20 can be obtained by placing an order to a ceramic board manufacturer with drawings. The power semiconductor devices (13HT, 13LT) can be obtained from a semiconductor manufacturer.

In the second step, as illustrated in part (e) of FIG. 2, the back-surface electrode of the high-side power semiconductor device 13HT is joined to the front side of the positive-electrode wiring conductor 12H and the back-surface electrode of the low-side power semiconductor device 13LT is joined to the front side of the bridge wiring conductor 12B by using a vacuum reflow apparatus, for example. Then, the negative-electrode wiring conductor 21L is joined to the front side of the bridge wiring conductor 12B between the high-side power semiconductor device 13HT and the low-side power semiconductor device 13LT with the insulating chip 20 interposed between the negative-electrode wiring conductor 21L and the bridge wiring conductor 12B. In doing so, a carbon positioning jig is desirably used for accurate positioning of the power semiconductor devices (13HT, 13LT) and the insulating chip 20. Note that the joining method is not limited to soldering. It is also possible to use a joining method using an electrically conductive adhesive, a joining method using submicron particles of a conductor such as Ag or Cu, a solid-phase (or liquid-phase) diffusion bonding method, or the like.

Lastly in the third step, the front-surface electrodes (source electrodes, gate electrodes) of the power semiconductor devices (13HT, 13LT) and the wiring conductors (12B, 12HG, 12HS, 21L, 12LG, 12LS) are connected with the bonding wires (18BT, 18HG, 18HS, 18LT, 18LG, 18LS) by using a wire bonding apparatus. Consequently, the half-bridge power semiconductor module 1 in FIG. 1 is completed.

Comparative Example

Next, operations and advantageous effects achieved by the half-bridge power semiconductor module 1 in FIG. 1 will be described with reference to a comparative example illustrated in FIG. 21.

In recent years, next-generation power conversion devices (inverters and converters) that are actuated via high-speed switching in a high-voltage range of 600 V to 1.8 kV have been actively developed with the advent of power semiconductor devices (such as MOSFET, JFET, and SBD) using wide-bandgap semiconductors such as silicon carbide (SiC) and gallium nitride (GaN) and power Si-MOSFETs with super junction structures. These power semiconductor devices are capable of high-speed switching actuation of course because they are devices that perform unipolar operation at high voltage. A first benefit of the high-speed switching actuation is that the switching loss of the power semiconductor devices is reduced, thereby enhancing the conversion efficiency. However, what is more important in practice is a second benefit that the reduction in switching loss accordingly prevents the conversion efficiency from dropping and allows the switching frequency (or carrier frequency) to be raised. This is because if the switching frequency is raised, large passive parts such as coupling capacitors and reactors can be smaller in volume, which leads to reduction in dimension and cost of the power conversion devices.

Meanwhile, power modules have been known which include one or more half-bridge (power) circuits housed within a single package as a main circuit of a power conversion device for controlling a large inductive load such as a motor, an inductor, or a transformer. Each of these half-bridge (power) circuits is a circuit including two power semiconductor device chips connected in series with a middle point in their connection configured as an output terminal.

In some cases, however, switching this half-bridge (power) circuit at high speed causes the following problems (1) to (3).

(1) A high surge voltage (or overshoot voltage) is generated at a moment of turning off a power semiconductor device from an ON state, which increases the switching loss.

(2) In the worst case, this surge voltage breaks the power semiconductor device.

(3) To avoid this risk, a power semiconductor device capable of withstanding higher voltage may be employed, which increases the conduction loss and then increases the manufacturing cost.

The above problems is caused by a reverse voltage induced by a parasitic inductance (self-inductance) Ls generated in a module wiring path through which a principal current (load current) flows, and an abrupt change in current (di/dt) (=−Ls×di/dt).

One method of reducing the parasitic inductance of a wiring is an electromagnetic method in which a transconductance effect obtained by causing currents to flow in opposite directions through outgoing and incoming wirings arranged close to each other is used to reduce the parasitic inductance (see Patent Literatures 1 and 2). Specifically, on the back surface of an insulating board with a bridge circuit formed on its front surface, a parallel wiring plate is provided which is set at the same potential as the high-side potential or the low-side potential. A principal current is caused to flow through the parallel wiring plate in the direction opposite to the front-surface principal current, so that "close and parallel counterflows" are generated.

FIG. 21 illustrates a comparative example in which this electromagnetic method is applied to reduce the parasitic inductance in a half-bridge power module 1000. In the half-bridge power module 1000, an insulating wiring board 115 includes a first insulating plate 116 and a second insulating plate 121. Front-surface wiring conductors (112H, 112B, 112L1, 112L2) are provided on the front surface of the first insulating plate 116, a middle wiring conductor 117L is provided between the first insulating plate 116 and the second insulating plate 121, and a thermal-stress alleviation conductor 122 is provided on the back surface of the second insulating plate 121. Connection conductors (120L1, 120L2) are buried in openings penetrating through the first insulating plate 116. The connection conductor 120L1 connects the front-surface wiring conductor 112L1 and the middle wiring conductor 117L, and the connection conductor 120L2 connects the front-surface wiring conductor 112L2 and the middle wiring conductor 117L.

A high-side terminal 114H is provided to the front-surface wiring conductor 112H, a low-side terminal 114L is provided to the front-surface wiring conductor 112L1, and a bridge terminal 114B is provided to the front-surface wiring conductor 112B.

The back-surface electrode (drain electrode) of a high-side power semiconductor device (switching element) 113HT is joined to the front-surface wiring conductor 112H, and the back-surface electrode (drain electrode) of a low-side power semiconductor device (switching element) 113L is joined to the front-surface wiring conductor 112B. A front-surface electrode of the high-side power semiconductor device 113HT is connected to the front-surface wiring conductor 112B by bonding wires 118B. A front-surface electrode of the low-side power semiconductor device 113LT is connected to the front-surface wiring conductor 112L2 by bonding wires 118L.

Here, in the structure of the power module 1000 in FIG. 21, the middle wiring conductor 117L and the second insulating plate 121 are inserted between the first insulating plate 116 and the thermal-stress alleviation conductor 122. This makes the thermal resistance of the insulating wiring board 115 higher than a simple insulating board with an insulating plate and conducting plates attached to its both surfaces, which is widely used today. Thus, there has been a problem of poor heat dissipation of the power semiconductor devices (113HT, 113LT), that is, high joint temperature. Meanwhile, the second insulating plate 121 affects the thermal resistance more greatly than the middle wiring conductor 117L since the thermal conductivity of the second insulating plate 121 is significantly low.

Operations and Advantageous Effects of First Embodiment

A principal current flowing through the positive-electrode wiring conductor 12H and a principal current flowing through the plurality of bonding wires 18BT are equal to each other in magnitude and are opposite and parallel to each other in direction. Also, a principal current flowing through the bridge wiring conductor 12B and a principal current flowing through the plurality of bonding wires 18LT are equal to each other in magnitude and are opposite and parallel to each other in direction.

The bridge terminal 14B, the high-side terminal 14H, and the low-side terminal 17L are arranged close and parallel to each other. A principal current flowing through the high-side terminal 14H and a principal current flowing through the bridge terminal 14B are equal to each other in magnitude and are opposite and parallel to each other in direction. A principal current flowing through the low-side terminal 17L and a principal current through the bridge terminal 14B are equal to each other in magnitude and are opposite and parallel to each other in direction.

Further, the direction of the principal current flowing through the positive-electrode wiring conductor 12H and the direction of the principal current flowing through the high-side terminal 14H are substantially perpendicular to each other. The direction of the principal current flowing through the negative-electrode wiring conductor 21L and the direction of the principal current flowing through the low-side terminal 17L are substantially perpendicular to each other.

By directing the principal currents in this manner, the half-bridge power semiconductor module 1 in FIG. 1 can achieve a parasitic inductance as low as or lower than that of the half-bridge power module 1000 in FIG. 21.

Further, since the half-bridge power semiconductor module 1 in FIG. 1 includes a single-layer insulating plate 16, the half-bridge power semiconductor module 1 can achieve a parasitic inductance as low as or lower than that of the half-bridge power module 1000 in FIG. 21 and, in addition, achieve a thermal resistance as low as that of a conventional half-bridge power semiconductor module using an insulating wiring board including a single-layer insulating plate (the thermal resistance of the insulating wiring board).

First, the reason why the half-bridge power semiconductor module 1 in the first embodiment can achieve a thermal resistance as low as that of the conventional half-bridge power semiconductor module. Generally, Joule heat generated by a power semiconductor device propagates vertically toward a heat radiator coupled to the back of its insulating wiring board. The total thermal resistance of members forming the path of this propagation is the thermal resistance of the insulating wiring board.

The half-bridge power semiconductor module 1 in the first embodiment has the same vertical structure as the conventional half-bridge power semiconductor module, as is clear from the cross-sectional structure in part (b) of FIG. 1. That is, the half-bridge power semiconductor module 1 in the first embodiment uses the insulating wiring board 15 with the single-layer insulating plate 16. Thus, the thermal resistance of the insulating wiring board 15 according to the first embodiment can be considered equal to the thermal resistance of the conventional insulating wiring board. As described in equation (1), where Rth_C1 is the thermal resistance of the wiring conductors (12H, 12B), Rth_I1 is the thermal resistance of the insulating plate 16, Rth_C2 is the thermal resistance of the thermal-stress alleviation conductor 22, the thermal resistance, or Rth_sub, of the insulating wiring board 15 is these thermal resistances connected in series.

$$Rth\_sub = Rth\_C1 + Rth\_I1 + Rth\_C2 \quad (1)$$

The thermal resistance Rth_sub of the insulating wiring board, described in equation (1), is equal to that of the conventional half-bridge power semiconductor module using an insulating wiring board including a single-layer insulating plate.

In contrast, the thermal resistance Rth_sub of the comparative example (FIG. 21) can be expressed by equation (2), where Rth_Cm and Rth_I2 are the thermal resistances of the middle wiring conductor 117L and the second insulating plate 121, respectively.

$$Rth\_sub = Rth\_C1 + Rth\_I1 + (Rth\_Cm + Rth\_I2) + Rth\_C2 \quad (2)$$

Here, as is clear from a comparison between equation (1) and equation (2), the thermal resistance of the half-bridge power semiconductor module 1 in the first embodiment is lower than that of the comparative example (FIG. 21) by the thermal resistances of the middle wiring conductor 117L and the second insulating plate 121 (Rth_Cm+Rth_I2). Hence, the half-bridge power semiconductor module 1 in the first embodiment is also mathematically understood as having thermally superior performance.

Next, three reasons why the half-bridge power semiconductor module 1 in the first embodiment can achieve a parasitic inductance as low as or lower than that of the comparative example (FIG. 21) will be described.

To start with, the first reason is as follows. As illustrated in FIG. 1, while, for example, the low-side power semiconductor device 13LT is turned on, a principal current ILL indicated by arrows and dotted lines flows in the half-bridge power semiconductor module 1. The principal current ILL flows into the module from the bridge terminal 14B, flows through the bridge wiring conductor 12B, turns back at the low-side power semiconductor device 13LT, flows through the plurality of bonding wires 18L and the negative-electrode wiring conductor 21L, and flows out of the module from the low-side terminal 17L. As described above, while the low-side power semiconductor device 13LT is turned on, principal currents (ILL) that are equal in magnitude and opposite in direction circulate at mutually close positions in almost all points including the terminals (14B, 17L). Thus, a configuration that allows "close and parallel counterflows" of principal currents (ILL) is obtained at almost all regions in the principal-current flow path. This makes it possible to ideally electromagnetically reduce the parasitic inductance Ls generated in the flow path of the principal current which flows while the low-side power semiconductor device 13LT is turned on.

Figure 3:
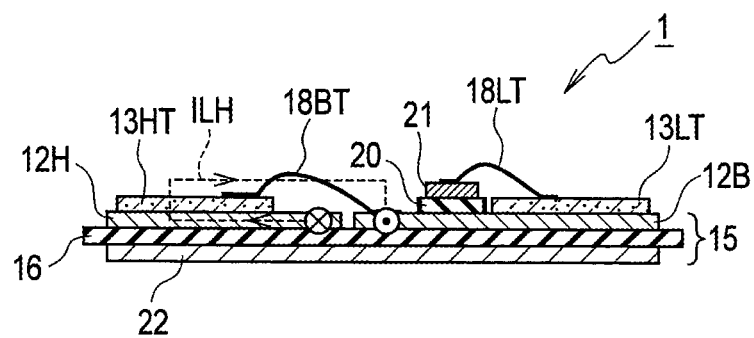
FIG. 3 Part (a) of FIG. 3 illustrates a principal current ILH which flows while a high-side power semiconductor device (switch) 13HT in FIG. 1 is turned on, part (b) of FIG. 3 illustrates a principal current (loop current) ILL which flows through a diode in a low-side power semiconductor device (switch) 13LT in FIG. 1, and part (c) of FIG. 3 illustrates a principal current (loop current) ILH which flows through a diode in the high-side power semiconductor device (switch) 13HT in FIG. 1.
Figure 3:
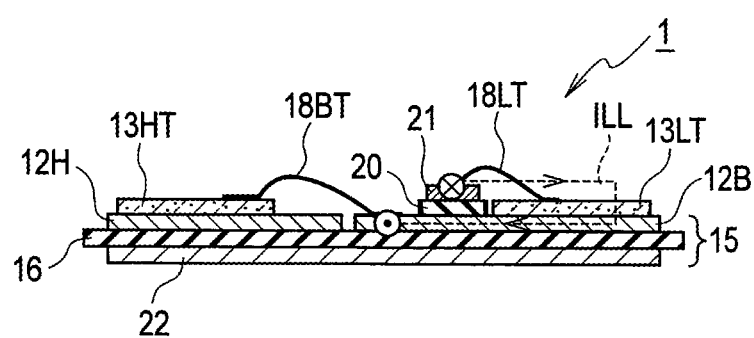
Figure 3:
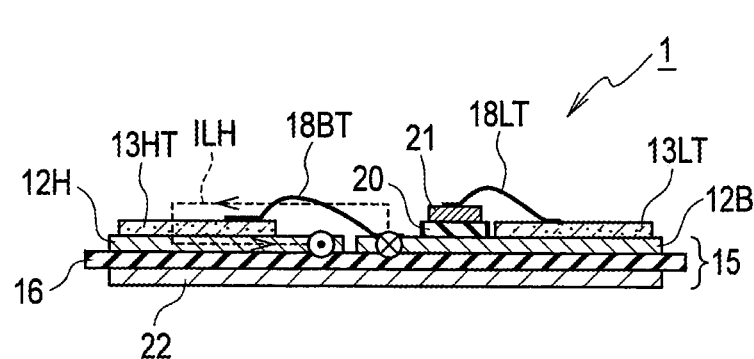

A principal current ILH illustrated in part (a) of FIG. 3 represents a principal current which flows while the high-side power semiconductor device (switch) 13HT in FIG. 1 is turned on. A principal current (loop current) ILL illustrated in part (b) of FIG. 3 represents a principal current (loop current) which flows while the diode incorporated in the low-side power semiconductor device (switch) 13LT in FIG. 1 is reverse conduction. A principal current (loop current) ILH illustrated in part (c) of FIG. 3 represents a principal current (loop current) which flows during reverse conduction of the diode incorporated in the high-side power semiconductor device (switch) 13HT in FIG. 1. A "close and parallel counterflow" configuration is likewise obtained for the principal currents (ILH, ILL) illustrated in part (a) to part (c) of FIG. 3 at almost all regions in the flow paths of these principal currents. This makes it possible to ideally electromagnetically reduce the parasitic inductances Ls generated in the flow paths of the principal currents.

Further, in the steady states illustrated in part (b) of FIG. 1 and part (a) to part (c) of FIG. 3, close and parallel counterflows are generated individually on each of the high-side block and the low-side block. Thus, even in a transient state where the switching state changes (a moment of turning on or off a power semiconductor device), close and parallel counterflows can be generated irrespective of the type of the load. For example, in a transient state where the low-side power semiconductor device 13LT is turned off, the close and parallel counterflows illustrated in part (b) of FIG. 1 and the close and parallel counterflows illustrated in part (c) of FIG. 3 are generated simultaneously. It can be seen that, in such a transient state too, the principal currents branched to the high side and the low side generate close and parallel counterflows at their respective sides. This applies to the other transient states, that is, when the low-side power semiconductor device 13LT is turned on and when the high-side power semiconductor device 13HT is turned off or turned on. This operation can significantly effectively reduce not only the voltage surge that occurs in the transient states but also current ringing.

In contrast, the structure of the power module in the comparative example (FIG. 21) inevitably includes sections where "close and parallel counterflows" of principal currents are incomplete. The structure thus has a problem that the parasitic inductance Ls cannot be reduced as desired and therefore the voltage surge cannot be reduced as desired either. The influence of this is severer for loads in which resistive components are dominant.

To specifically describe this, a broken line ILL and the arrows thereon in FIG. 21 illustrate the flow of a principal current (load current) while the low-side power semiconductor device 113LT is turned on. The principal current (ILL) is inputted into the power module from the bridge terminal 114B, flows through the front-surface wiring conductor 112B, the low-side power semiconductor device 113LT, the bonding wire 118L, the front-surface wiring conductor 112L2, the connection conductor 120L2, the middle wiring conductor 117L, the connection conductor 120L1, and the front-surface wiring conductor 112L1, and is outputted from the low-side terminal 114L. Here, in a first section G1 in FIG. 21, the principal current (ILL) flowing on the front-surface side of the insulating board 115 and the principal current (ILL) flowing on the back-surface side of the insulating board 115 are directed in opposite directions. The principal currents can thus bring out the "close and parallel counterflow" effect and therefore achieve a low parasitic inductance Ls. On the other hand, in a second section G2 next to the first section G1, the principal current (ILL) flows only through the middle wiring conductor 117L. Thus, the principal current does not bring out the "close and parallel counterflow" effect, so that a large parasitic inductance Ls is generated in the second section G2.

A broken line ILH and the arrows thereon in FIG. 21 illustrate the flow of a principal current (load current) while the high-side power semiconductor device 113HT is turned on. The principal current (ILH) is inputted into the power module from the high-side terminal 114H, flows through the front-surface wiring conductor 112H, the high-side power semiconductor device 113HT, the bonding wire 118B, and the front-surface wiring conductor 112B, and is outputted from the bridge terminal 114B. It should be noted here that the principal current (ILH) does not at all flows through the middle wiring conductor 117L and does not therefore bring out the "close and parallel counterflow" effect. That is, the parasitic inductance Ls in the current path (114H, 112H, 113HT, 118B, 112B, 114B) of the principal current (ILH) is high while the high-side power semiconductor device 113HT is turned on.

Likewise, the parasitic inductance in the second section G2 is also large when the high-side power semiconductor device 113HT or the low-side power semiconductor device 113LT is in a commutation mode.

As described above, the first embodiment does not have the section G2 in the comparative example, in which "close and parallel counterflow" cannot be generated. For this reason, the first embodiment can reduce the parasitic inductance Ls more effectively than the comparative example under any load conditions.

The second reason why a low parasitic inductance can be achieved is that the principal-current flow path is shorter than the comparative example. In the comparative example (FIG. 21), two connection ports (connection conductors 120L1 and 120L2) need to be provided in the first insulating plate 116 in order to cause a principal current to flow through the middle wiring conductor 117L. This makes the principal-current flow path longer than the first embodiment (part (b) of FIG. 1), which does include such connection ports. A shorter current flow path effects a reduction in parasitic inductance, and the first embodiment can therefore make the parasitic inductance smaller than the comparative example. Also, making the principal-current flow path shorter than the comparative example can bring about an advantageous effect that the module's dimension can be reduced.

The third reason why a low parasitic inductance can be achieved is that the distance between two principal currents flowing opposite and parallel to each other (outgoing current and incoming current) is short. The two principal currents in the comparative example (FIG. 21) have the insulating plate 116 therebetween. On the other hand, the two principal currents in the first embodiment (part (b) of FIG. 1) do not have the insulating plate 16 therebetween. In the first embodiment, the two principal currents (outgoing current and incoming current) is closer by the thickness of the insulating plate 116. With the effect of this closeness, the first embodiment can make the parasitic inductance smaller than the comparative example.

The operations and advantageous effects mentioned above apply to other embodiments and modifications to be described below.

Modification 1

Besides the above, the first embodiment has an advantageous effect unique thereto. The high-side terminal 14H, the low-side terminal 17L, and the bridge terminal 14B are gathered in one spot and lead out from a side surface of the insulating wiring board 15. In this way, a snubber capacitor (or a decoupling capacitor) can be easily provided between the high-side terminal 14H and the bridge terminal 14B and between the bridge terminal 14B and the low-side terminal 17L.

Figure 4:
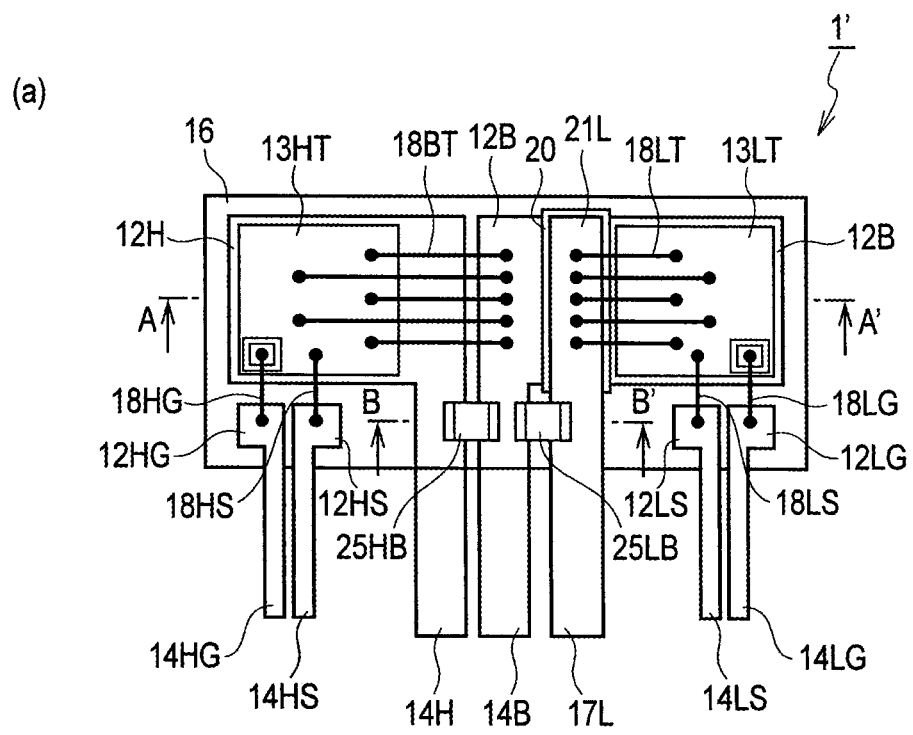
FIG. 4 Part (a) of FIG. 4 is a plan view illustrating modification 1 in which snubber capacitors (25HB, 25LB) are added to the half-bridge power semiconductor module 1 in FIG. 1, and part (b) of FIG. 4 is a cross-sectional view taken along cross-sectional plane B-B' in part (a) of FIG. 4.
Figure 4:
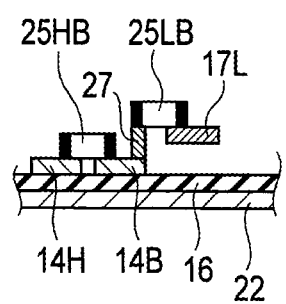

The half-bridge power semiconductor module 1 may further include at least one of a high-side snubber capacitor 25HB connected between the high-side terminal 14H and the bridge terminal 14B at the main surface of the insulating plate 16, and a low-side snubber capacitor 25LB connected between the bridge terminal 14B and the low-side terminal 17L at the main surface of the insulating plate 16. As illustrated in FIG. 4, these snubber capacitors can be easily provided in the module and on the respective terminals. By providing the snubber capacitors, it is possible to suppress surge voltages generated by parasitic inductance components around the high-side terminal 14H and the low-side terminal 17L.

A half-bridge power semiconductor module 1' illustrated in FIG. 4 is a modification in which the snubber capacitors (25HB, 25LB) are installed in the module. The snubber capacitor 25HB capacitively connects the high-side terminal 14H and the bridge terminal 14B with solder or the like near their connections to the positive-electrode wiring conductor 12H and the bridge wiring conductor 12B. Similarly, the snubber capacitor 25LB capacitively connects the low-side terminal 17L and the bridge terminal 14B with solder or the like near their connections to the negative-electrode wiring conductor 21L and the bridge wiring conductor 12B. A metal spacer 27 connects between the bridge terminal 14B and the snubber capacitor 25LB. Solder is used for the connection between the bridge terminal 14B and the metal spacer 27 and the connection between the metal space 27 and the snubber capacitor 25LB. The other features of the configuration are the same as FIG. 1, and description thereof will therefore be omitted.

In modification 1, the snubber capacitors (25HB, 25LB) are mounted near the connections to the positive-electrode wiring conductor 12H, the bridge wiring conductor 12B, and the negative-electrode wiring conductor 21L. In this way, surge voltages resulting from the parasitic inductances in the respective terminals (14H, 14B, 17L) can be absorbed. This makes it possible to further reduce the surge voltages applied the power semiconductor devices (13HT, 13LT).

In contrast, in the comparative example (FIG. 21), the bridge terminal is located at a position far from the high-side terminal and the low-side terminal. Hence, it is difficult to install snubber capacitors inside the module, and they have to be provided outside the module. With the snubber capacitors provided outside the module, however, it is impossible to absorb the voltage surge occurring due to the parasitic inductances around the bridge terminal, the high-side terminal, and the low-side terminal.

Second Embodiment

In the first embodiment and modification 1, the cases have been discussed in which each of the high-side power semiconductor device 13HT and the low-side power semiconductor device 13LT is a switching element (i.e. a transistor such as an MOSFET or a JFET). However, one of the high-side power semiconductor device and the low-side power semiconductor device may be a diode and the other may be a transistor and, even in this case, it is still possible to reduce the parasitic inductance Ls and consequently reduce the surge voltage generated upon turning on the transistor.

In a second embodiment, a half-bridge power semiconductor module 2 including a diode on one side and a transistor on the other side will be described, which is widely used for DC-DC converters called step-down choppers and step-up choppers.

Figure 5:
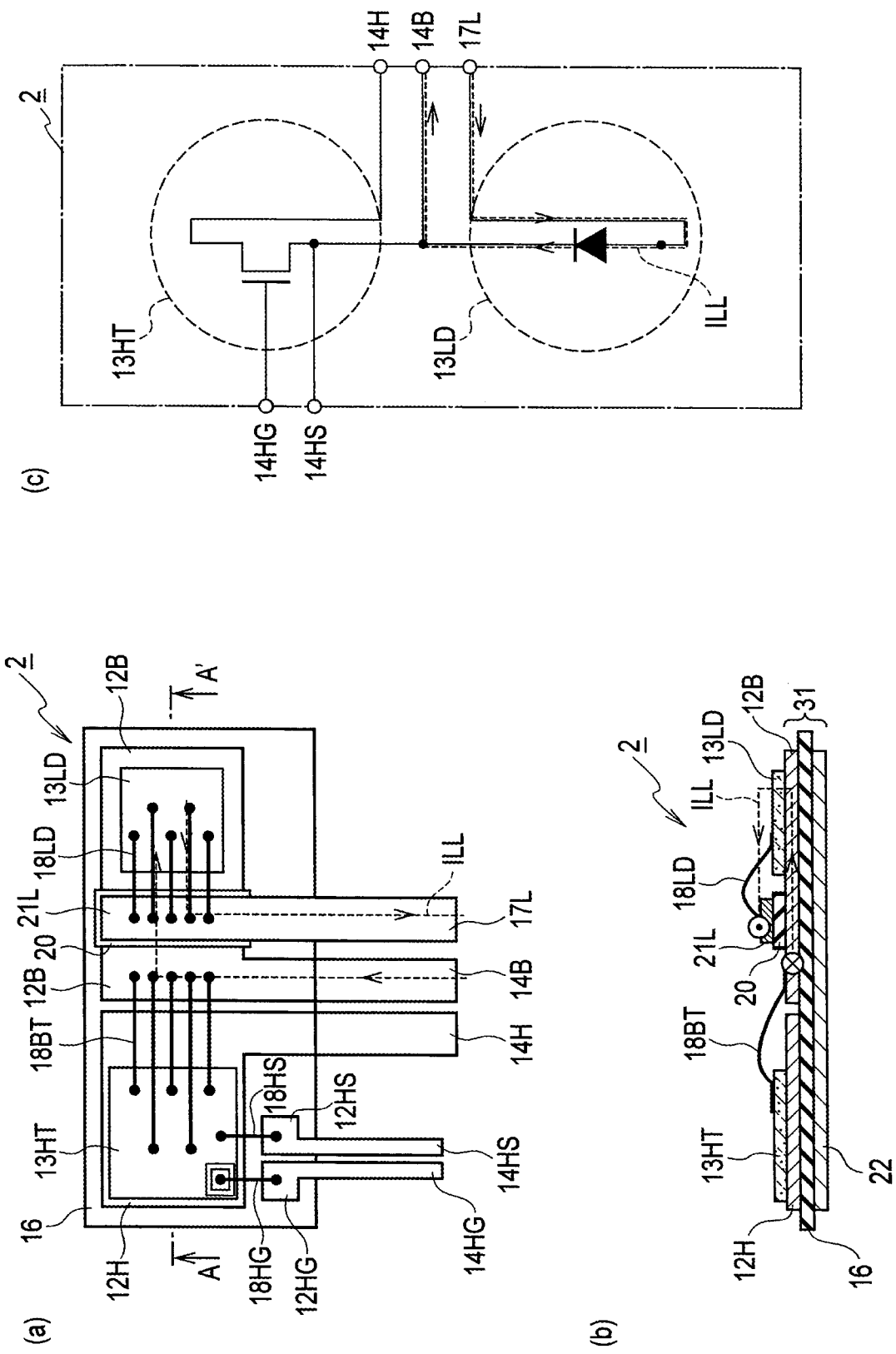
FIG. 5 Part (a) of FIG. 5 is a plan view illustrating the structure of a half-bridge power semiconductor module 2 according to a second embodiment, part (b) of FIG. 5 is a cross-sectional view taken along cross-sectional plane A-A' in part (a) of FIG. 5, and part (c) of FIG. 5 is a circuit diagram of the half-bridge power semiconductor module 2.

The configuration of the half-bridge power semiconductor module 2 according to the second embodiment will be described with reference to FIG. 5. Part (a) of FIG. 5 is a plan view, part (b) of FIG. 5 is a cross-sectional view taken along cross-sectional plane A-A' in part (a) of FIG. 5, and part (c) of FIG. 5 is a circuit diagram of the half-bridge power semiconductor module 2.

One of the high-side power semiconductor device and the low-side power semiconductor device is a power switching element, and the other is a power diode. Specifically, the half-bridge power semiconductor module 2 includes a high-speed freewheeling power diode 13LD arranged on the front surface of a bridge wiring conductor 12B as the low-side power semiconductor device. The high-speed freewheeling power diode 13LD is formed of a Schottky diode or a high-speed pn diode, for example. The back-surface electrode (cathode) of the high-speed freewheeling power diode 13LD is die-bonded to the front surface of the bridge wiring conductor 12B with solder or the like. On the other hand, a front-surface electrode (anode) of the high-speed freewheeling power diode 13LD is connected to a negative-electrode wiring conductor 21L by a plurality of bonding wires 18LD. Bonding ribbons or clip leads may be used instead of bonding wires. A high-side power semiconductor device (switch) 13HT may be a unipolar switch as in the first embodiment or a bipolar switch. Also, a reverse conducting diode does not necessarily have to be included.

The half-bridge power semiconductor module 2 includes an insulating wiring board 31. Since the high-speed freewheeling power diode 13LD does not include a gate electrode, the insulating wiring board 31 does not include a low-side gate-signal wiring conductor (12LG) or source-signal wiring conductor (12LS). Besides this point, the configuration of the insulating wiring board 31 is the same as the insulating wiring board 15 in part (a) of FIG. 1. The insulating wiring board 31 does not include low-side bonding wires (18LG, 18LS) or signal terminals (14LG, 14LS) either.

For the other reference signs, the configuration is the same as FIG. 1, and description thereof will therefore be omitted. Generally, in the case of a step-down chopper, a DC power source's positive electrode is connected to the high-side terminal 14H, the DC power source's negative electrode is connected to the low-side terminal 17L, and an energy storing coil and a smoothing capacitor connected in series are connected between the bridge terminal 14B and the low-side terminal 14L. A DC voltage stepped down is outputted from both ends of this smoothing capacitor.

Meanwhile, the half-bridge power semiconductor module 2 in FIG. 5 can be manufactured by the same method as the manufacturing method in the first embodiment, which has been described with reference to part (a) to part (e) of FIG. 2. It is, however, assumed that the insulating wiring board 15 in part (a) to part (e) of FIG. 2 is replaced with the insulating wiring board 31, the low-side power semiconductor device (switch) 13LT is replaced with the high-speed freewheeling power diode 13LD, the bonding wires 18LT are replaced with the bonding wires 18LD, and the wiring conductors (12LG, 12LS), the bonding wire (18LG, 18LS), and the signal terminal (14LG, 14LS) are removed.

Advantageous effects of the second embodiment will be described. A principal current (load current) ILH which flows while the high-side power semiconductor device 13HT is turned on is the same as that in part (a) of FIG. 3 and achieves an advantageous effect similar to that described in the first embodiment. Moreover, as illustrated in FIG. 5, a principal current (load current) ILL flows through the high-speed freewheeling power diode (low-side power semiconductor device) 13LD after the high-side power semiconductor device 13HT is turned off. The principal current (load current) ILL illustrated in FIG. 5 is the same as that in part (b) of FIG. 1 and provides an advantageous effect similar to that described in the first embodiment. Further, the "close and opposite counterflows" illustrated in part (a) and the "close and opposite counterflows" illustrated in part (b) of FIG. 3 are generated simultaneously in a transient state where the high-side power semiconductor device 13HT is turned on or turned off. In this transient state too, "close and opposite counterflows" are generated individually at each of the high-side region and the low-side region. This brings about an advantageous effect that the parasitic inductance is reduced and the surge voltage is reduced accordingly.

Third Embodiment

Depending on a half-bridge power semiconductor module's attribute or application, there are cases where a high-speed freewheeling power diode FWD (Schottky diode or high-speed pn diode) needs to be connected in anti-parallel to its high-side power semiconductor device (switch) or low-side power semiconductor device (switch). These cases include, for example: when the power semiconductor device is a bipolar power semiconductor device (switch) like an IGBT, in which it is in principle difficult to implement reverse conduction; when the power semiconductor device (switch) is a unipolar type but does not incorporate a reverse conducting diode; when the reverse conducting diode incorporated in the power semiconductor device (switch) cannot cause sufficient current to flow or the reverse conduction of the incorporated diode is not desired; and so on. As will be discussed below, the present invention is also applicable to such cases.

In a third embodiment, the high-side power semiconductor device and the low-side power semiconductor device may both be formed of a power switching element and a high-speed freewheeling power diode as a pair connected in anti-parallel.

Figure 6:
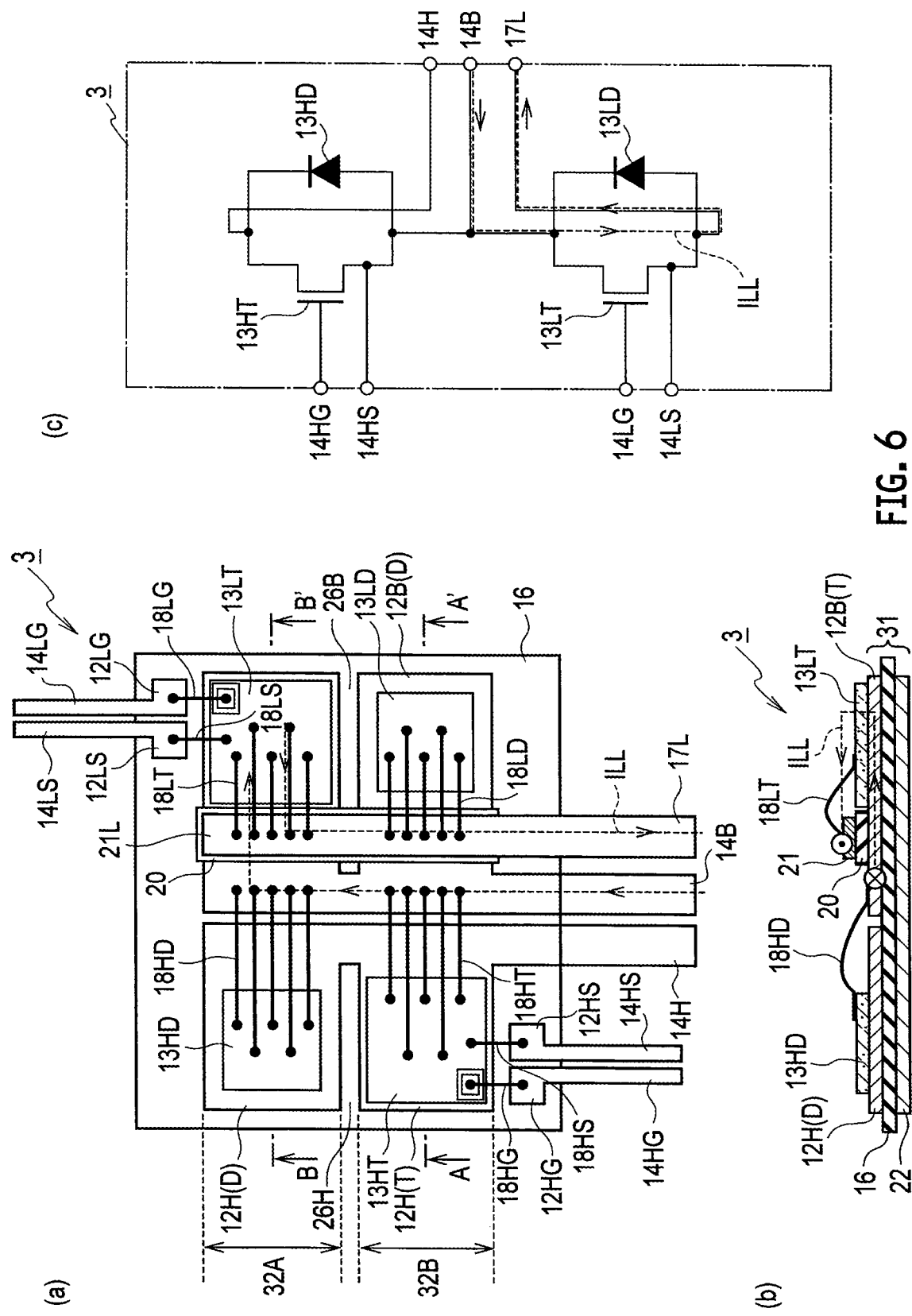
FIG. 6 Part (a) of FIG. 6 is a plan view illustrating the structure of a half-bridge power semiconductor module 3 according to a third embodiment, part (b) of FIG. 6 is a cross-sectional view taken along cross-sectional plane B-B' in part (a) of FIG. 6, and part (c) of FIG. 6 is a circuit diagram of the half-bridge power semiconductor module 3.

FIG. 6 illustrates the configuration of a half-bridge power semiconductor module 3 according to the third embodiment of the present invention. Part (a) of FIG. 6 is a plan view, part (b) of FIG. 6 is a cross-sectional view taken along cross-sectional plane B-B' in part (a) of FIG. 6, and part (c) of FIG. 6 is a circuit diagram of the half-bridge power semiconductor module 3. A cross-sectional view taken along cross-sectional plane A-A' in part (a) of FIG. 6 is the same as part (b) of FIG. 5, and illustration thereof will therefore be omitted.

At least one of the high-side power semiconductor device and the low-side power semiconductor device includes a power switching element (13HT, 13LT) and a power diode (13HD, 13LD) connected in anti-parallel to the power switching element.

Specifically, the half-bridge power semiconductor module 3 includes a high-side power semiconductor device (switch) 13HT and a high-side power semiconductor device (diode)

13HD. The back-surface electrodes of the high-side power semiconductor device (switch) 13HT and the high-side power semiconductor device (diode) 13HD are joined to a positive-electrode wiring conductor 12H. Between the high-side power semiconductor device (switch) 13HT and the high-side power semiconductor device (diode) 13HD, a slit 26H is formed which partitions the positive-electrode wiring conductor 12H into a switch region 12H(T) and a diode region 12H(D).

Similarly, the half-bridge power semiconductor module 3 includes a low-side power semiconductor device (switch) 13LT and a low-side power semiconductor device (diode) 13LD. The back-surface electrodes of the low-side power semiconductor device (switch) 13LT and the low-side power semiconductor device (diode) 13LD are joined to a bridge wiring conductor 12B. Between the low-side power semiconductor device (switch) 13LT and the low-side power semiconductor device (diode) 13LD, a slit 26B is formed which partitions the bridge wiring conductor 12B into a switch region 12B(T) and a diode region 12B(D).

By providing the slits (26H, 26B), the following operations and advantageous effects are achieved. Specifically, with the slit 26H, the centroidal line of a load current flowing through the positive-electrode wiring conductor 12H(T) (or 12H(D)) and the centroidal line of a load current flowing through a plurality of bonding wires 18HT (or 18HD) in the opposite direction are close to each other (or overlap each other). Accordingly, the parasitic inductance can be further reduced. Similarly, with the slit 26B, the centroidal line of a load current flowing through the bridge wiring conductor 12B(T) (or 12B(D)) and the centroidal line of a load current flowing through a plurality of bonding wires 18LT (or 18LD) in the opposite direction are close to each other (or overlap each other). Accordingly, the parasitic inductance can be further reduced.

The high-side power semiconductor device (switch) 13HT and the high-side power semiconductor device (diode) 13HD are die-bonded to predetermined positions in the switch region 12H(T) and the diode region 12H(D), respectively, by using solder or the like. The low-side power semiconductor device (switch) 13LT and the low-side power semiconductor device (diode) 13LD are die-bonded to predetermined positions in the switch region 12B(T) and the diode region 12B(D), respectively. The other constituent members are the same as those in FIG. 1 or FIG. 5, and description thereof will be omitted.

To facilitate understanding, the half-bridge power semiconductor module 3 will be discussed by individually focusing on a region 32A and a region 32B. Each of the regions is the same as the second embodiment, in which one of the high side and the low side is a switch (power semiconductor device) and the other is a diode (power semiconductor device). For this reason, the flow of a principal current (load current) while the switch (13HT, 13LT) is turned on or turned off, and the flow of a principal current (load current) while the diode (13HD, 13LD) is in reverse conduction (commutation) are exactly the same as the second embodiment and are close and parallel counterflows, including transient states. Also, the configurations of the input-output terminals (14H, 14B, 17L) are the same as the second embodiment as well. Then, the third embodiment can simultaneously reduce the parasitic inductance and the thermal resistance in the module as in the second embodiment and thus as in the first embodiment.

Now, modifications of the third embodiment or some useful modifications applicable to all of the first to third embodiments will be described.

Modification 2

Figure 7:
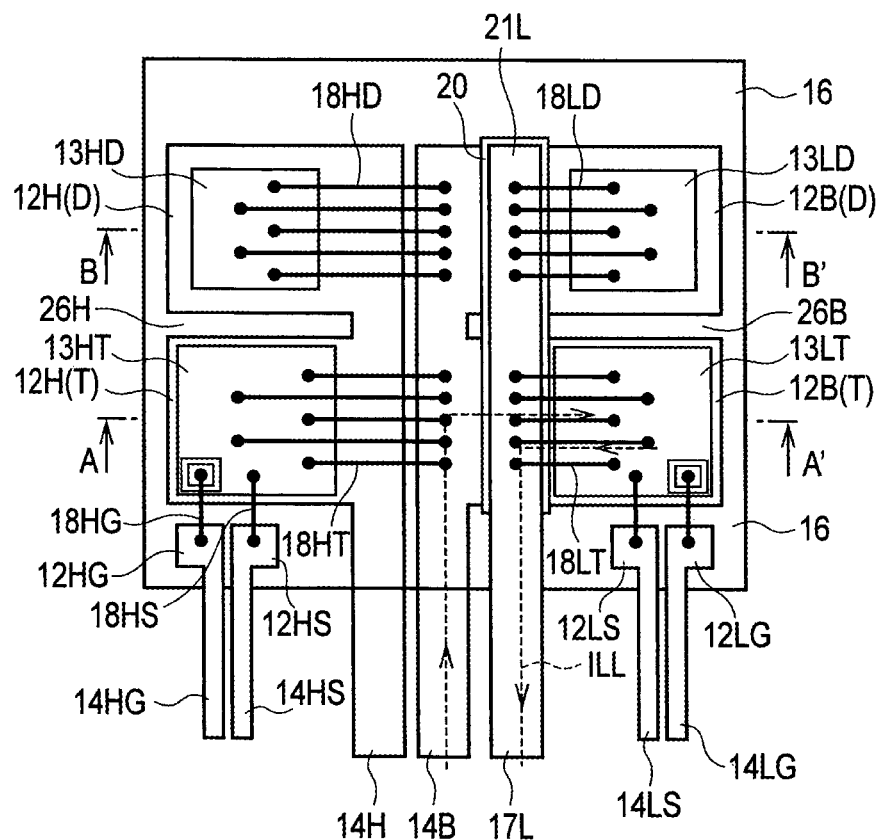
FIG. 7 Part (a) of FIG. 7 is a plan view illustrating the structure of a half-bridge power semiconductor module 3-1 according to modification 2 of the third embodiment, and part (b) of FIG. 7 is a cross-sectional view taken along cross-sectional plane B-B' in part (a) of FIG. 7.
Figure 7:
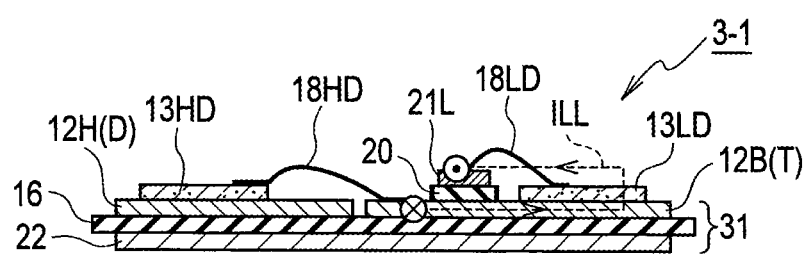

FIG. 7 illustrates the configuration of a half-bridge power semiconductor module 3-1 according to modification 2 of the third embodiment. Part (a) of FIG. 7 is a plan view, and part (b) of FIG. 7 is a cross-sectional view taken along cross-sectional plane B-B' in part (a) of FIG. 7. A cross-sectional view taken along cross-sectional plane A-A' in part (a) of FIG. 7 is the same as part (b) of FIG. 1 and the circuit diagram is the same as part (c) of FIG. 6, and illustration thereof will therefore be omitted.

Differences between the half-bridge power semiconductor module 3-1 and the half-bridge power semiconductor module 3 in FIG. 6 will be described. The first difference is that the position of the low-side power semiconductor device (switch) 13LT and the position of the low-side power semiconductor device (diode) 13LD are switched. With the positions switched as above, the arrangement of the high side and the arrangement of the low side are substantially symmetric about the input-output terminals (14H, 14B, 17L). This brings about an advantageous effect that the overall balance of parasitic inductance between the high side and the low side can be better than FIG. 6. Also, by the above change, the low-side gate-signal terminal 14LG and the source-signal terminal 14LS are moved to the lower side, thereby leaving an empty space on the upper side. Thus, the change brings about the advantage that dimensions of the insulating wiring board (module) 31 can be smaller. Note that the manufacturing steps are the same as the first embodiment (FIG. 2), and description thereof will therefore be omitted.

Meanwhile, the half-bridge power semiconductor modules (3, 3-1) can be used in applications involving continually outputting electric pulses of the same polarity like DC-DC converters that perform PWM and PWM inverters that output sinusoidal waveforms. In this case, an operation is repeated in which the switch on one side (e.g. high side) is turned on or turned off and the diode on the other side (e.g. low side) is caused to perform commutation. In the case of such an operation mode, the configuration of the third embodiment (FIG. 6) has a less adverse influence of unbalanced parasitic inductances than modification 2 and is therefore superior thereto. As can be understood from this example, an embodiment or a modification thereof which is best for the application should be selected, and this policy is applied to all embodiments.

In at least one of the positive-electrode wiring conductor 12H and the bridge wiring conductor 12B, the slit (26H, 26B) is formed as a partition between the power switching element (13HT, 13LT) and the power diode (13HD, 13LD). This allows a good overall balance of parasitic inductance between the high side and the low side.

Modification 3

Figure 8:
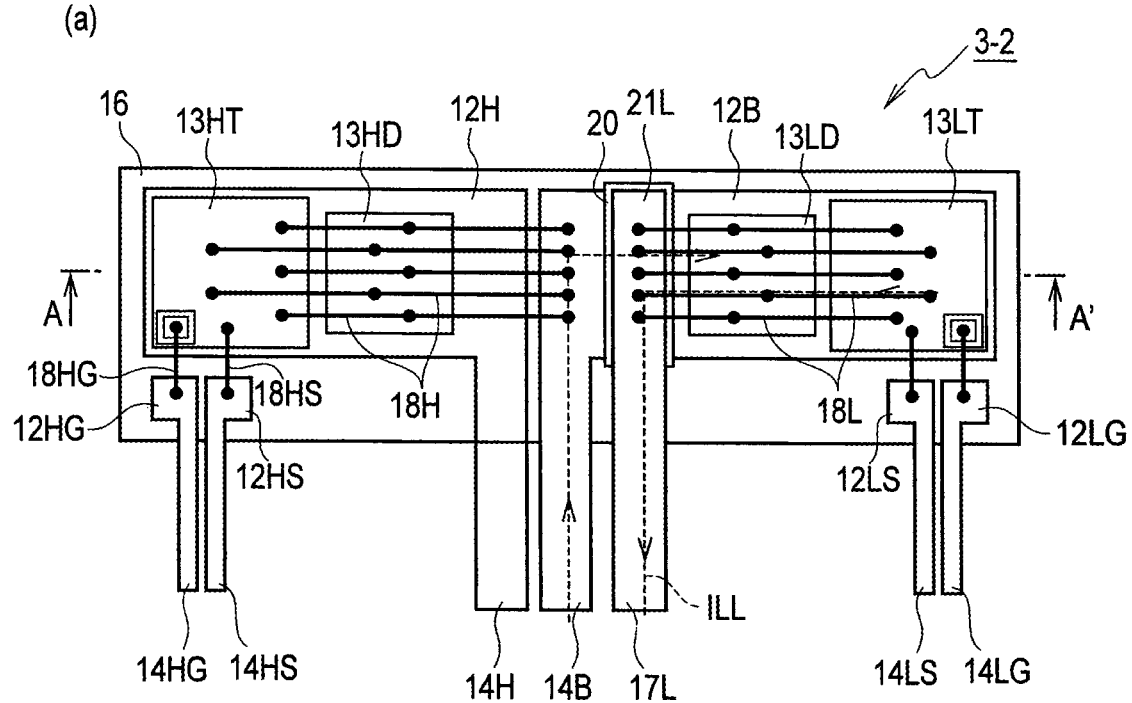
FIG. 8 Part (a) of FIG. 8 is a plan view illustrating the structure of a half-bridge power semiconductor module 3-2 according to modification 3 of the third embodiment, and part (b) of FIG. 8 is a cross-sectional view taken along cross-sectional plane A-A' in part (a) of FIG. 8.
Figure 8:
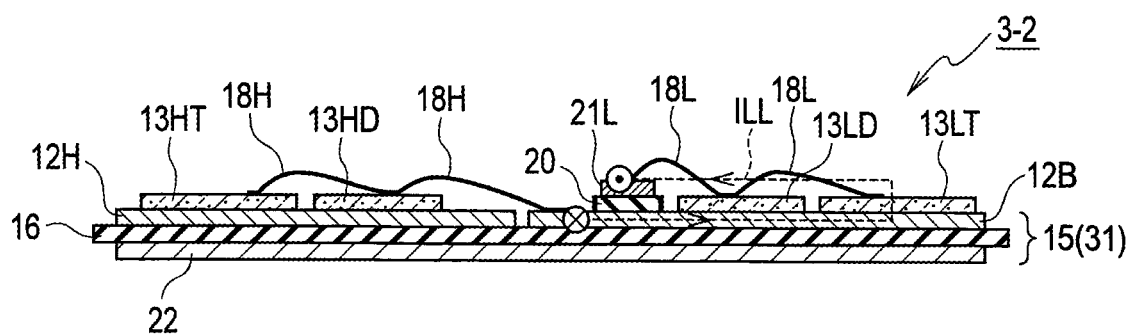

FIG. 8 illustrates the configuration of a half-bridge power semiconductor module 3-2 according to modification 3 of the third embodiment. Part (a) of FIG. 8 is a plan view, and part (b) of FIG. 8 is a cross-sectional view taken along cross-sectional plane A-A' in part (a) of FIG. 8. As illustrated in FIG. 8, all high-side power semiconductor devices (13HT, 13HD) and all low-side power semiconductor devices (13LD, 13LT) are arranged sideways in a line on the insulating wiring board 15 (or 31). All power semiconductor devices (13HT, 13HD, 13LT, 13LD) are arranged in a single straight line perpendicular to the input-output terminals (14H, 14B, 17L). In this way, modification 3 can provide a power semiconductor module having a short depth.

The positive-electrode wiring conductor 12H is extended in a direction perpendicular to the input-output terminals (14H, 14B, 17L), and the high-side power semiconductor device (switch) 13HT and the high-side power semiconductor device (diode) 13HD are die-bonded side by side to the front side of the positive-electrode wiring conductor 12H. Similarly, the bridge wiring conductor 12B is extended in the direction perpendicular to the input-output terminals (14H, 14B, 17L), and the low-side power semiconductor device (diode) 13LD and the low-side power semiconductor device (switch) 13LT are die-bonded side by side to the front side of the bridge wiring conductor 12B. A plurality of bonding wires 18H link a front-surface electrode of the high-side power semiconductor device (switch) 13HT, a front-surface electrode of the high-side power semiconductor device (diode) 13HD, and the bridge wiring conductor 12B. A plurality of bonding wires 18L link a front-surface electrode of the low-side power semiconductor device (switch) 13LT, a front-surface electrode of the low-side power semiconductor device (diode) 13LD, and the negative-electrode wiring conductor 21L. In FIG. 8, the plurality of bonding wires (18H, 18L) are depicted as sticking bonding wires. In this way, the power semiconductor devices (13HT, 13HD, 13LT, 13LD) can be arranged sideways in a line.

The members with the other reference signs are their roles are the same as those with the same reference signs in the first to third embodiments and their modifications, and description thereof will therefore be omitted. Also, the half-bridge power semiconductor module 3-2 according to modification 3 can be manufactured using the same method as the first embodiment (FIG. 2), and description of the manufacturing steps will therefore be omitted.

As illustrated in part (b) of FIG. 8, in modification 3 too, the insulating wiring board 15 includes a single-layer insulating plate 16, as in the first to third embodiments and their modifications. Thus, it is possible to achieve a thermal resistance as low as the first to third embodiments and their modifications. Hence, the thermal resistance is lower and the heat dissipation is better than the comparative example (FIG. 21), which includes a two-layer insulating plate.

Figure 9:
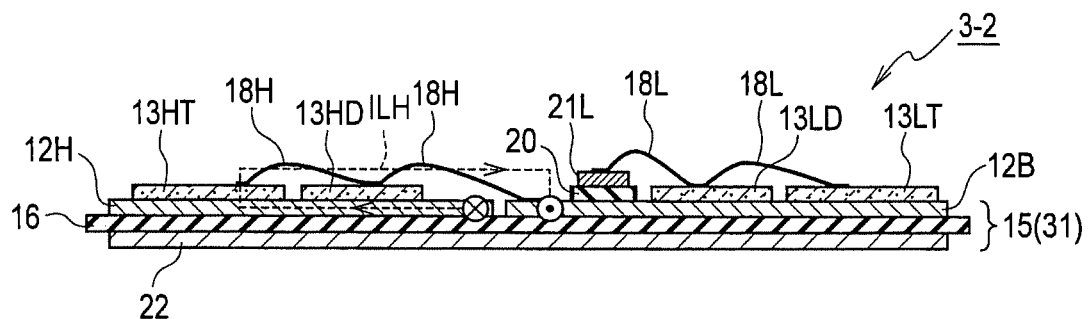
FIG. 9 Part (a) of FIG. 9 illustrates a principal current ILH which flows while a high-side power semiconductor device (switch) 13HT in FIG. 8 is turned on, part (b) of FIG. 9 illustrates a principal current (loop current) ILL which flows through a low-side power semiconductor device (diode) 13LD in FIG. 8, and part (c) of FIG. 9 illustrates a principal current (loop current) ILH which flows through a high-side power semiconductor device (diode) 13HD in FIG. 8.
Figure 9:
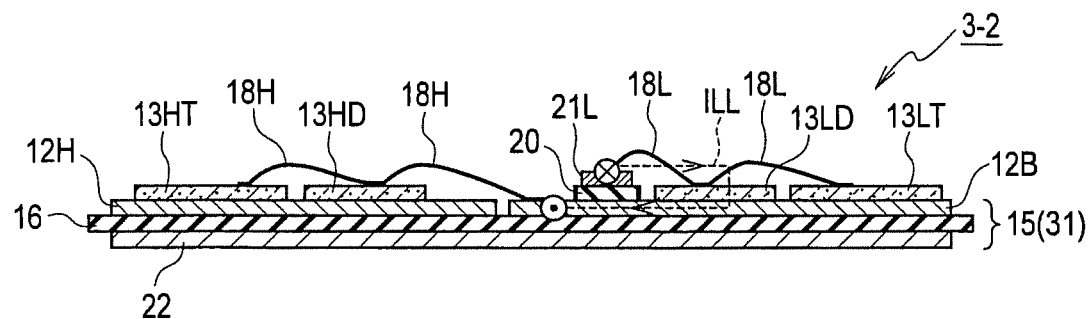
Figure 9:
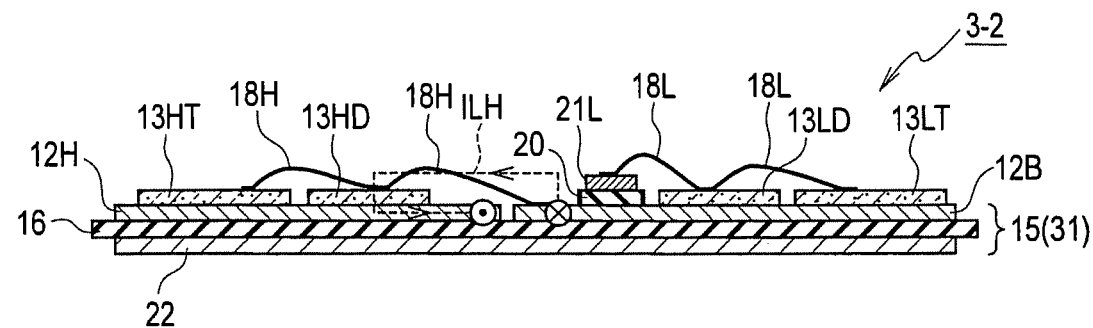

FIG. 8 and part (a) to part (c) of FIG. 9 illustrate principal currents (load currents) ILH and ILL in the half-bridge power semiconductor module 3-2 according to modification 3. FIG. 8 illustrates a principal current ILL which flows while the low-side power semiconductor device (switch) 13LT is turned on. Part (a) of FIG. 9 illustrates a principal current ILH which flows while the high-side power semiconductor device (switch) 13HT in FIG. 8 is turned on. Part (b) of FIG. 9 illustrates a principal current (loop current) ILL which flows through the low-side power semiconductor device (diode) 13LD in FIG. 8. Part (c) of FIG. 9 illustrates a principal current (loop current) ILH which flows through the high-side power semiconductor device (diode) 13HD in FIG. 8. As is clear from FIG. 8 and part (a) to part (c) of FIG. 9, the principal currents (loop currents) ILH and ILL are close and parallel counter flows in all electric conduction modes.

As described above, two or more high-side power semiconductor devices (13HT, 13HD) are aligned in one direction in such a way as to share a flow path for the principal currents (ILH) flowing through each of the positive-electrode wiring conductor 12H and the plurality of bonding wires 18H. In this way, the principal currents (loop currents) ILH can generate close and parallel counterflows.

As described above, two or more low-side power semiconductor devices (13LT, 13LD) are aligned in one direction in such a way as to share a flow path for the principal currents (ILL) flowing through each of the bridge wiring conductor 12B and the plurality of bonding wires 18L. In this way, the principal currents (loop currents) ILL can generate close and parallel counterflows.

Modification 4

Modification 4 is an example applicable to all of the first to third embodiments and their modifications, and is an example effective in reducing the parasitic inductances around the input-output terminals (14H, 14B, 17L). Modification 4 applied to the third embodiment (FIG. 6) will be described with reference to FIG. 10.

Figure 10:
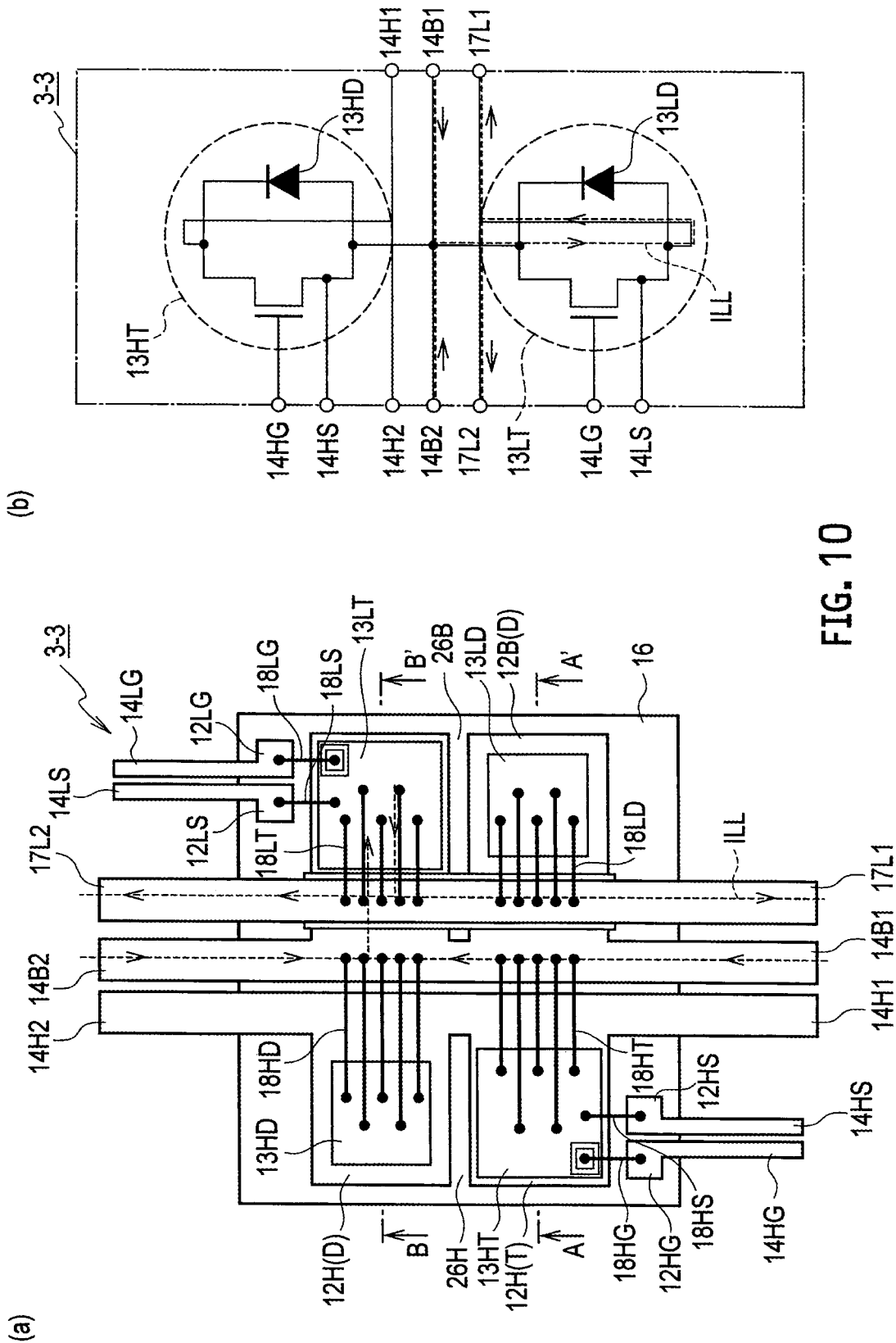
FIG. 10 Part (a) of FIG. 10 is a plan view illustrating the structure of a half-bridge power semiconductor module 3-3 according to modification 4 of the third embodiment, and part (b) of FIG. 10 is a circuit diagram of the half-bridge power semiconductor module 3-3.

In a half-bridge power semiconductor module 3-3 illustrated in FIG. 10, high-side terminals (14H1, 14H2) are part of the positive-electrode wiring conductor 12H extended in two opposite directions parallel to the main surface of the insulating plate 16. Similarly, bridge terminals (14B1, 14B2) are part of the bridge wiring conductor 12B extended in two opposite directions parallel to the main surface of the insulating plate 16. Low-side terminals (17L1, 17L2) are part of the negative-electrode wiring conductor 21L in two opposite directions parallel to the main surface of the insulating plate 16.

A cross-sectional view taken along cross-sectional plane A-A' in part (a) of FIG. 10 is the same as part (b) of FIG. 5, and a cross-sectional view taken along cross-sectional plane B-B' in part (a) of FIG. 10 is the same as part (b) of FIG. 6. The other reference signs are the same as the third embodiment (FIG. 6), and description thereof will therefore be omitted.

The method of manufacturing the half-bridge power semiconductor module 3-3, illustrated in FIG. 10, is the same as the manufacturing method in the third embodiment, and description therefore will therefore be omitted.

As illustrated in FIG. 10, in modification 4, two high-side terminals, two bridge terminals, and two low-side terminals are provided. In this way, it is possible to split the flow of each principal current (ILH, ILL) flowing into or out of the power module into two flows while maintaining a close and parallel counterflow around each terminal. Splitting a principal current into two flows is electromagnetically equivalent to reducing the parasitic inductance around each terminal by half. That is, in addition to the parasitic-inductance reduction effect of the third embodiment, modification 4 has an excellent advantageous effect that the parasitic inductances generated around the input-output terminals for principal currents can be approximately half of the third embodiment.

Note that in modification 4 too, the insulating wiring board 15 includes a single-layer insulating plate 16, and therefore a thermal resistance as low as that of a conventional power semiconductor module is achieved. Hence, the thermal resistance is lower and the heat dissipation is better than the comparative example (FIG. 21), which includes a two-layer insulating plate.

Fourth Embodiment

In the first to third embodiments and their modifications, the high-side terminal 14H, the bridge terminal 14B, and the low-side terminal 17L are part of the positive-electrode wiring conductor 12H, part of the bridge wiring conductor 12B, and part of the negative-electrode wiring conductor 21L extended in parallel to the front surface of the insulating plate 16 beyond its outer edge, respectively. However, these input-output terminals are not limited to these extended-wiring terminal structures (14H, 14B, 17L). It is also possible to lead out the input-output terminals in a direction perpendicular to the front surface of the insulating plate 16 with the low parasitic-inductance property of the input-output terminals maintained. Here, those terminals led out in a direction perpendicular to the front surface of the insulating plate 16 will be referred to as "standing terminals". A fourth embodiment will show that it is possible to provide a half-bridge power semiconductor module including standing terminals.

Figure 11A:
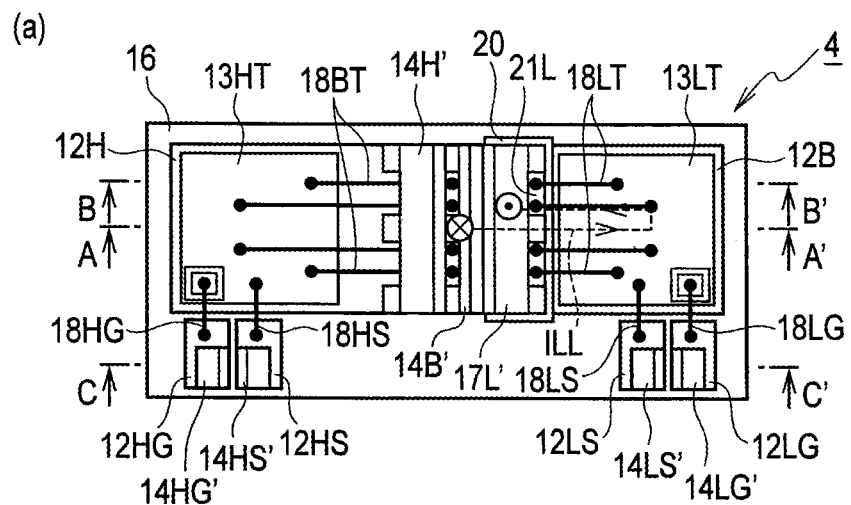
FIG. 11A Part (a) of FIG. 11A is a plan view illustrating the structure of a half-bridge power semiconductor module 4 according to a fourth embodiment, part (b) of FIG. 11A is a cross-sectional view taken along cross-sectional plane A-A' in part (a) of FIG. 11A, and part (c) of FIG. 11A is a cross-sectional view taken along cross-sectional plane B-B' in part (a) of FIG. 11A.
Figure 11A:
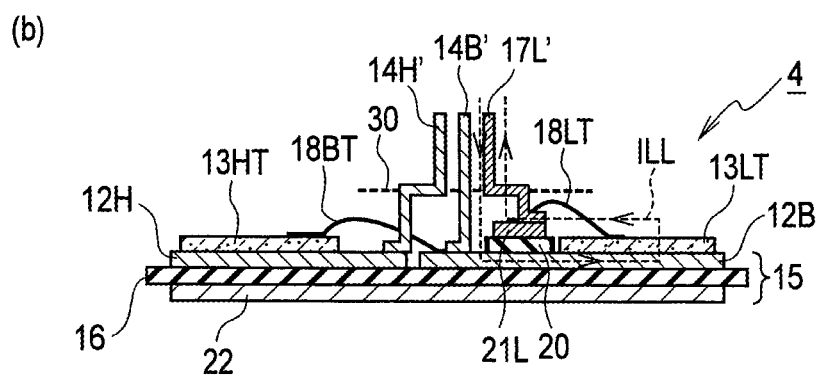
Figure 11A:
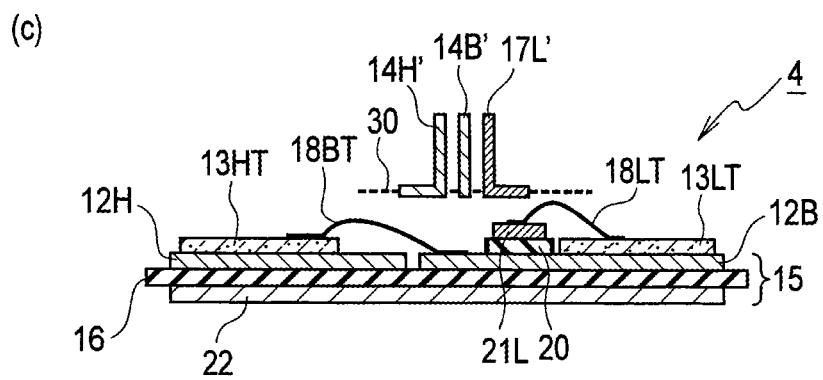
Figure 11B:
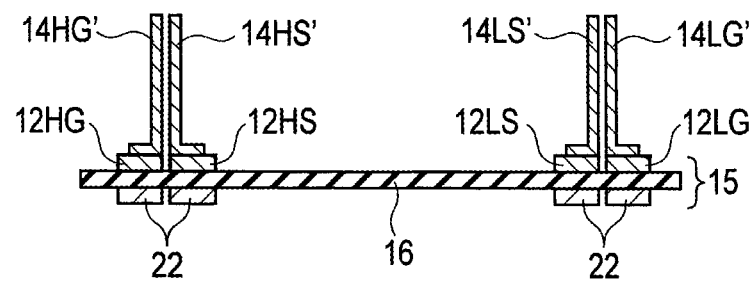
FIG. 11B Part (a) of FIG. 11B is a cross-sectional view taken along cross-sectional plane C-C' in part (a) of FIG. 11A, and part (b) of FIG. 11B is a circuit diagram of the half-bridge power semiconductor module 4.
Figure 11B:
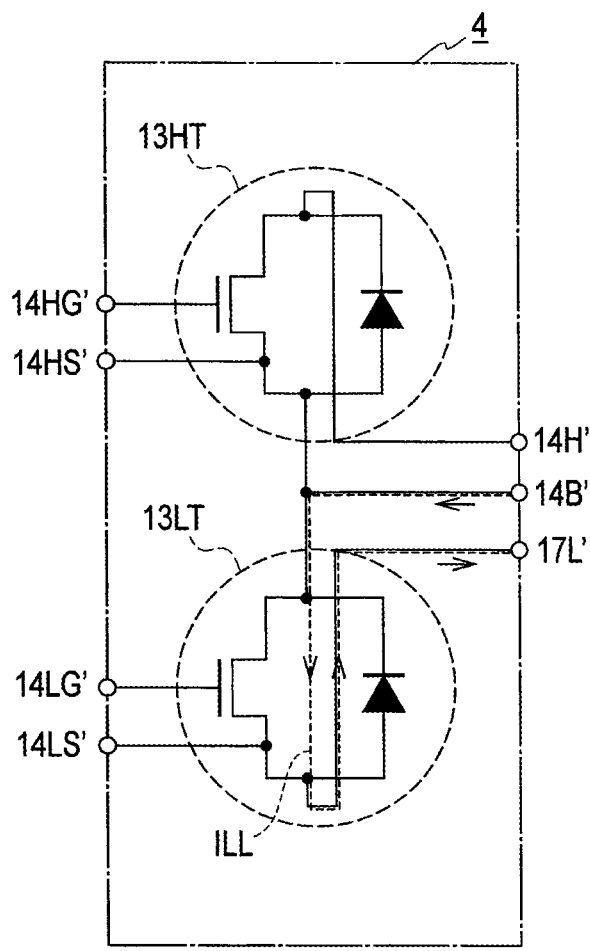

An example where the extended-wiring terminal structures in the first embodiment (FIG. 1) (14H, 14B, 17L, 14HG, 14HS, 14LG, 14LS) are modified into standing terminals will be described as a representative example of the fourth embodiment. FIG. 11A and FIG. 11B illustrate the configuration of a half-bridge power semiconductor module 4 according to the fourth embodiment. Part (a) of FIG. 11A illustrates a plan view, part (b) of FIG. 11A is a cross-sectional view taken along cross-sectional plane A-A' in part (a) of FIG. 11A, part (c) of FIG. 11A is a cross-sectional view taken along cross-sectional plane B-B' in part (a) of FIG. 11A, part (a) of FIG. 11B is a cross-sectional view taken along cross-sectional plane C-C' in part (a) of FIG. 11A, and part (b) of FIG. 11B is a circuit diagram. Note that a plurality of bonding wires (18BT, 18LT) which are not actually present in the A-A' cross section are depicted in part (b) of FIG. 11A for reference to the positions of the plurality of bonding wires (18BT, 18LT).

A bridge terminal 14B' is a plate-shaped standing terminal standing from the front surface of an insulating wiring board 15. The bridge terminal 14B' is electrically and physically joined to a bridge wiring conductor 12B by solder or the like. The portions of the bridge terminal 14B' and the bridge wiring conductor 12B connected to each other are situated between a high-side power semiconductor device 13HT and a low-side power semiconductor device 13LT. A section of the bridge terminal 14B' below a height level 30 is slit into a plurality (e.g. three) of branches. The bridge terminal 14B' has a rake-shaped (fork-shaped) structure. The bridge terminal 14B' includes a flat plate-shaped base portion standing in a direction normal to the main surface of a insulating plate 16, and a plurality of tooth portions branching in parallel to each other from the base portion. The tips of the plurality of tooth portions are connected to the bridge wiring conductor 12B.

A high-side terminal 14H' is a plate-shaped standing terminal standing from the front surface of the insulating wiring board 15. The high-side terminal 14H' is electrically and physically joined to a positive-electrode wiring conductor 12H by a silver alloy, solder, or the like. The portions the high-side terminal 14H' and the positive-electrode wiring conductor 12H connected to each other are situated between the high-side power semiconductor device 13HT and the bridge terminal 14B'. A low-side terminal 17L' is a plate-shaped standing terminal standing from the front surface of the insulating wiring board 15. The low-side terminal 17L' is electrically and physically joined to a negative-electrode wiring conductor 21L by a silver alloy, solder, or the like. The portions the low-side terminal 17L' and the negative-electrode wiring conductor 21L connected to each other is situated between the bridge terminal 14B' and a low-side power semiconductor device 13LT. Each of the high-side terminal 14H' and the low-side terminal 17L' includes a flat plate-shaped base portion standing in the direction normal to the main surface of the insulating plate 16, and a plurality of tooth portions branching in parallel to each other from the base portion. The tips of the plurality of tooth portions are connected to the positive-electrode wiring conductor 12H or the negative-electrode wiring conductor 21L. The high-side terminal 14H', the bridge terminal 14B', and the low-side terminal 17L' are parallel to each other.

A plurality of bonding wires 18BT perpendicularly cross the bridge terminal 14B' by penetrating through the gaps between the tooth portions of the bridge terminal 14B'. A plurality of bonding wires 18LT are connected to the negative-electrode wiring conductor 21L between the tooth portions of the low-side terminal 17L'.

A gate-signal terminal 14HG' and a source-signal terminal 14HS' are flat plate-shaped standing terminals standing from the front surface of the insulating wiring board 15 in the direction normal to the main surface of the insulating plate 16, and are electrically and physically joined to a high-side gate-signal wiring conductor 12HG and source-signal wiring conductor 12HS. A gate-signal terminal 14LG' and a source-signal terminal 14LS' are flat plate-shaped standing terminals standing from the front surface of the insulating wiring board 15 in the direction normal to the main surface of the insulating plate 16, and are electrically and physically joined to a low-side gate-signal wiring conductor 12LG and source-signal wiring conductor 12LS. The gate-signal terminal (14HG', 14LG') and the source-signal terminal (14LG', 14LS') are parallel to each other. Moreover, the gate-signal terminal (14HG', 14LG') and the source-signal terminal (14LG', 14LS') are desirably as close as possible in view of reducing the gate inductance. Note that the extending terminals illustrated in FIG. 1 (14HG, 14HS, 14LG, 14LS) may be used in place of the standing terminals illustrated in part (a) of FIG. 11B (14HG', 14HS', 14LG', 14LS'). The other features of the configuration are the same as FIG. 1, and description thereof will be omitted.

An example of the method of manufacturing the half-bridge power semiconductor module 4, illustrated in FIG. 11, will be described with reference to FIG. 12.

Figure 12:
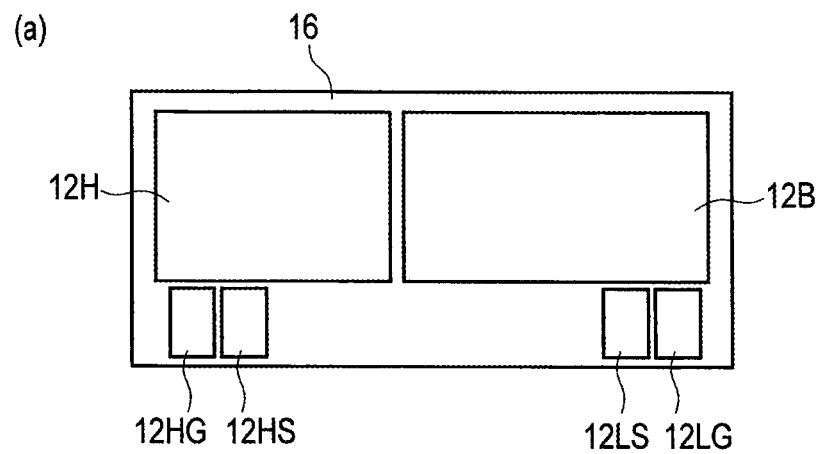
FIG. 12 Part (a) to part (c) of FIG. 12 are plan views illustrating a method of manufacturing the half-bridge power semiconductor module 4 in FIG. 11.
Figure 12:
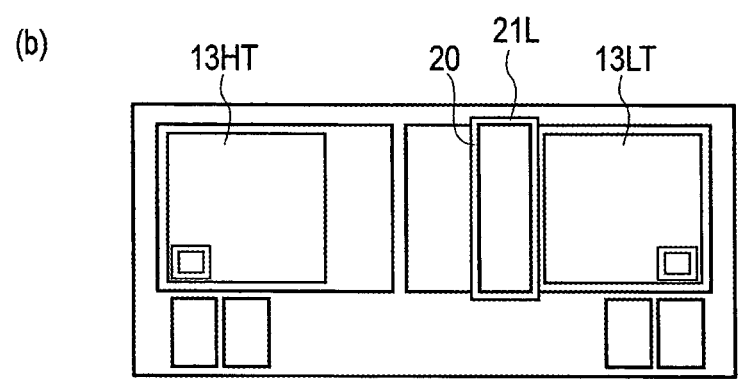
Figure 12:
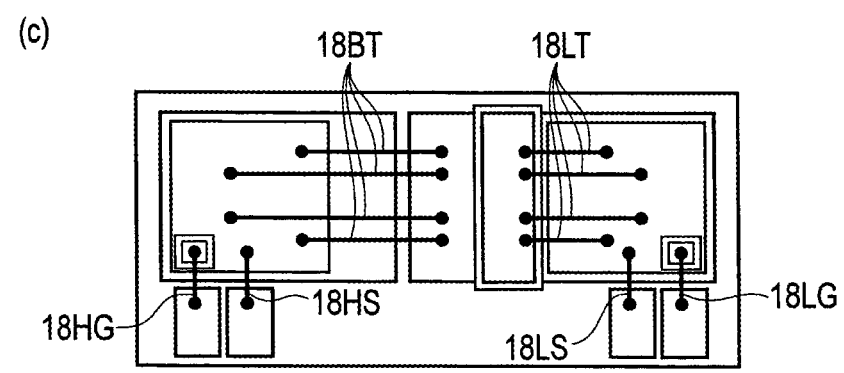

In the first step, as illustrated in part (a) of FIG. 12, an insulating wiring board including the positive-electrode wiring conductor 12H, the bridge wiring conductor 12B, the gate-signal wiring conductors (12HG, 12LG), and the source-signal wiring conductors (12HS, 12LS) is prepared. In addition, though not illustrated, an insulating chip 20 with the negative-electrode wiring conductor 21L joined thereto, the high-side power semiconductor device 13HT, and the low-side power semiconductor device 13LT are prepared. The insulating wiring board is thoroughly washed with an organic solvent such as acetone or ethanol.

Thereafter, in the second step, as illustrated in part (b) of FIG. 12, the back-surface electrodes of the power semiconductor devices (13HT, 13LT) are soldered to predetermined positions on the wiring conductors (12H, 12B) of the insulating wiring board 15 by using a vacuum reflow apparatus. The negative-electrode wiring conductor 21L is joined to the front side of the bridge wiring conductor 12B at a position between the high-side power semiconductor device 13HT and the low-side power semiconductor device 13LT with the insulating chip 20 interposed between the negative-electrode wiring conductor 21L and the bridge wiring conductor 12B. In doing so, a carbon positioning jig is desirably used for accurate positioning of the power semiconductor devices (13HT, 13LT) and the insulating chip 20. Note that the joining method is not limited to soldering. It is also possible to use joining using an electrically conductive adhesive, joining using submicron particles of a conductor such as Ag or Cu, solid-phase (or liquid-phase) diffusion bonding, or the like.

In the next third step, as illustrated in part (c) of FIG. 12, the front-surface electrodes (source electrodes, gate electrodes) of the power semiconductor devices (13HT, 13LT) and the wiring conductors (12B, 12HG, 12HS, 21L, 12LG, 12LS) are connected with bonding wires (18BT, 18HG, 18HS, 18LT, 18LG, 18LS) by using a wire bonding apparatus.

Lastly in the fourth step, the standing terminals (14H', 14B', 17L', 14HG', 14HS', 14LG', 14LS') are soldered to predetermined positions on the front surfaces of the wiring conductors (12H, 12B, 21L, 12HG, 12HS, 12LG, 12LS) by using solder paste and a vacuum reflow apparatus. A carbon positioning jig is desirably used for accurate positioning. The solder used in the fourth step is desirably a material lower in melting point than the solder used in the second step by 30° C. or higher. Consequently, the half-bridge power semiconductor module 4, illustrated in FIG. 11A and FIG. 11B, is completed.

As is clear from part (b) and part (c) of FIG. 11A, the insulating wiring board 15 includes a single-layer insulating plate 16. Thus, the thermal resistance is lower than the comparative example in FIG. 21, and a thermal resistance as low as that of a conventional power semiconductor module is achieved.

Figure 13:
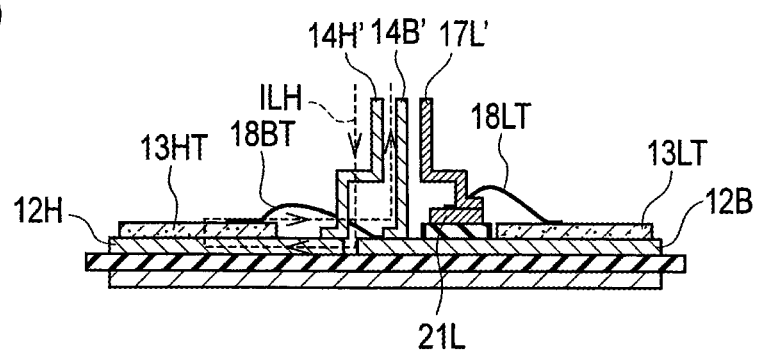
FIG. 13 Part (a) of FIG. 13 illustrates a principal current ILH which flows while a high-side power semiconductor device (switch) 13HT in FIG. 11A is turned on, part (b) of FIG. 13 illustrates a principal current (loop current) ILL which flows through a diode in a low-side power semiconductor device (switch) 13LT in FIG. 11A, and part (c) of FIG. 13 illustrates a principal current (loop current) ILH which flows through a diode in the high-side power semiconductor device (switch) 13HT in FIG. 11A.
Figure 13:
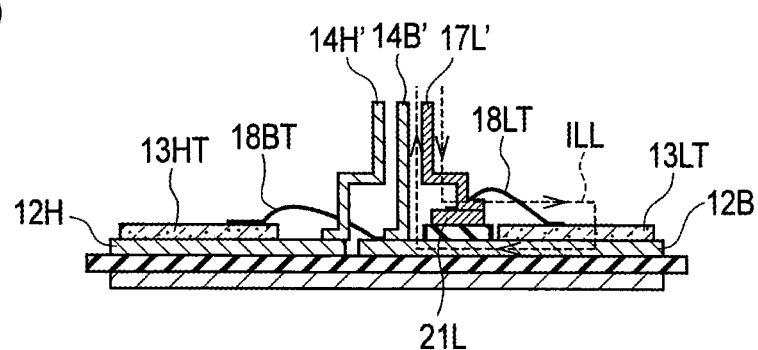
Figure 13:
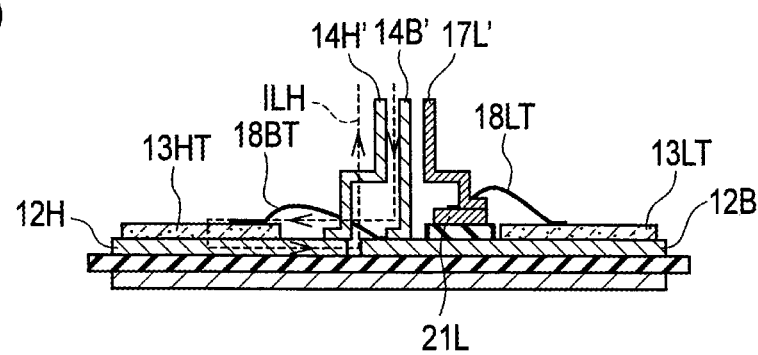

Part (b) of FIG. 11A and part (a) to part (c) of FIG. 13 illustrate all electric conduction modes of principal currents (load currents) ILH and ILL which flow in the half-bridge power semiconductor module 4. It can be seen that the principal currents (load currents) ILH and ILL generate close and parallel counterflows in all electric conduction modes.

Further, the flows of the principal currents around the input-output terminals (14H', 14B', 17L') will be considered in detail. In the terminal configuration of the fourth embodiment, the principal currents flow through wider regions and closer to each other in parallel and opposite directions than the first to third embodiments and their modifications. This is electromagnetically equivalent to reducing the parasitic inductances around the input-output terminals. Hence, according to the fourth embodiment, the parasitic inductances around the input-output terminals can be smaller than the first to third embodiments and their modifications.

As is confirmed from part (a) of FIG. 11A and part (a) of FIG. 11B, the structure of the standing gate-signal terminal 14HG' (14LG') and the standing source-signal terminal 14HS' (14LS') is such that their flat plates are closer to each other than the extending gate-signal terminal 14HG (14LG) and the extending source-signal terminal 14HS (14LS) in the first embodiment (FIG. 1). That is, the gate-signal terminals and the source-signal terminals in this embodiment have the advantage that they can achieve a lower gate parasitic inductance than the first to third embodiments and are accordingly advantageous for high-speed switching operation.

Fifth Embodiment

In the first to fourth embodiments and their modifications, the high-side power semiconductor device 13HT (13HD) and the low-side power semiconductor device 13LT (13LD) are bridge-connected. Moreover, an environment is established in which a low-side principal current (ILL) that flows through the plurality of bonding wires 18LT (18LD), which are an example of the low-side connection means for connecting the negative-electrode wiring conductor 21L and the power semiconductor device 13LT (13LD), and a low-side principal current (ILL) that flows through the bridge wiring conductor 12B are caused to flow close to each other in opposite directions. Thus, the insulating chip 20 with the negative-electrode wiring conductor 21L and the low-side terminal 17L' attached thereto plays an important role. However, as will be described in a fifth embodiment, it is also possible to provide a half-bridge power semiconductor module using a structure without the insulating chip 20.

While the fifth embodiment is applicable to all other embodiments and their modifications, description will be given below for convenience by using an example where the fifth embodiment is applied to the fourth embodiment (FIG. 11A and FIG. 11B). The same constituent elements as those in FIG. 11A and FIG. 11B will be denoted by the same reference signs, and description thereof will be omitted.

Figure 14A:
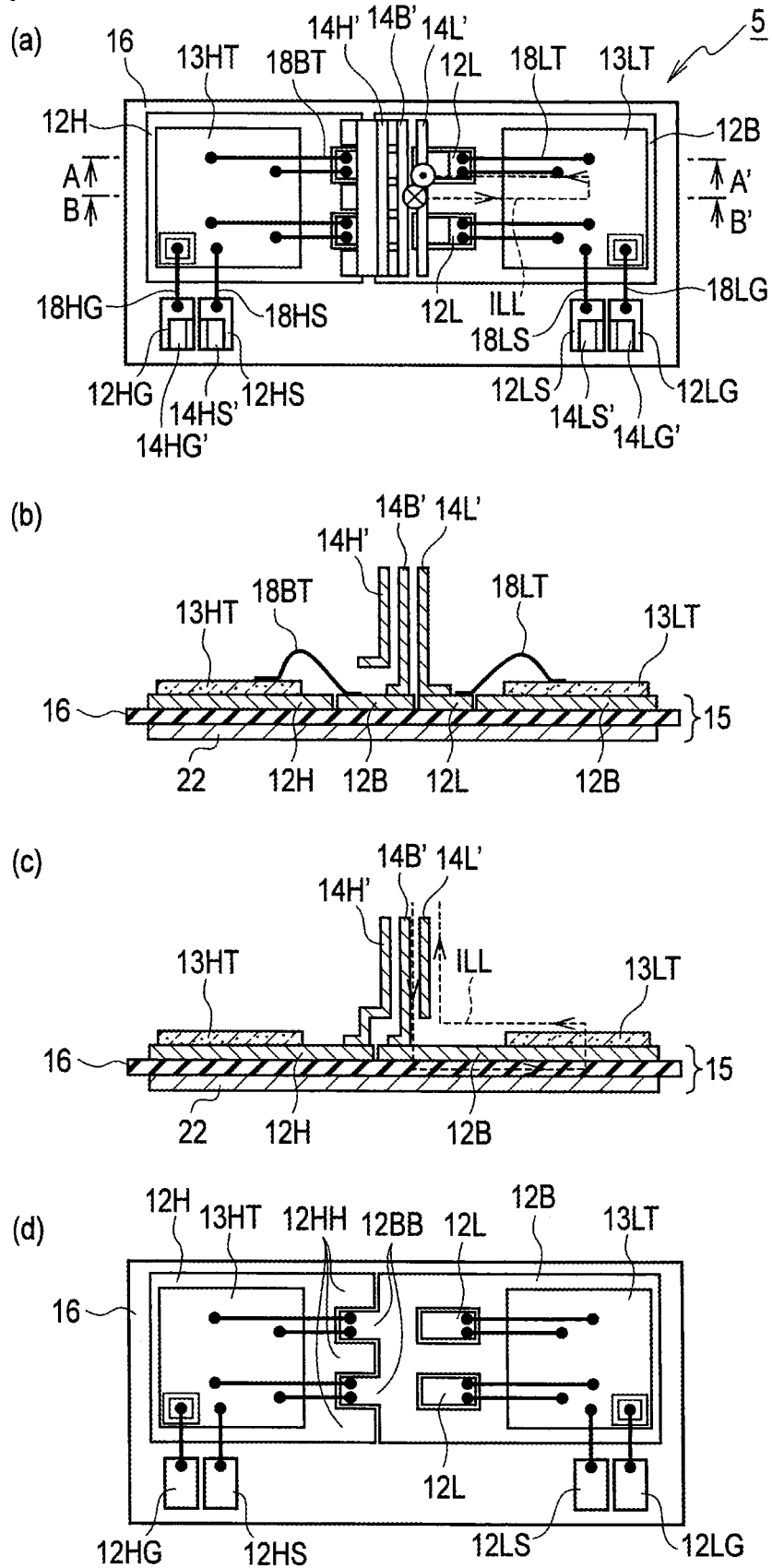
FIG. 14A Part (a) of FIG. 14A is a plan view illustrating the configuration of a half-bridge power semiconductor module 5 according to a fifth embodiment, part (b) of FIG. 14A is a cross-sectional view taken along cross-sectional plane A-A' in part (a) of FIG. 14A, part (c) of FIG. 14A is a cross-sectional view taken along cross-sectional plane B-B' in part (a) of FIG. 14A, and part (d) of FIG. 14A is an imaginary plan view obtained by removing standing terminals (14B', 14H', 14L', 14HG', 14HS', 14LG', 14LS') from part (a) of FIG. 14A.
Figure 14B:
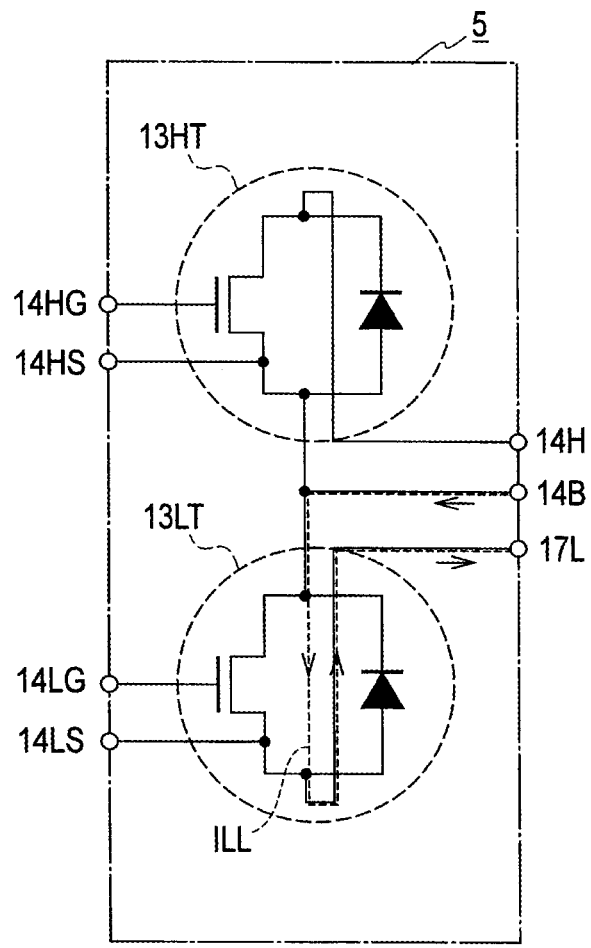
FIG. 14B is a circuit diagram of the half-bridge power semiconductor module 5.

The configuration of a half-bridge power semiconductor module 5 according to the fifth embodiment will be described with reference to FIG. 14A and FIG. 14B. Part (a) of FIG. 14A illustrates a plan view of the half-bridge power semiconductor module 5, part (b) of FIG. 14A is a cross-sectional view taken along cross-sectional plane A-A' in part (a) of FIG. 14A, and part (c) of FIG. 14A is a cross-sectional view taken along cross-sectional plane B-B' in part (a) of FIG. 14A. Part (d) of FIG. 14A is an imaginary plan view obtained by removing standing terminals (14B', 14H', 14L', 14HG', 14HS', 14LG', 14LS') from part (a) of FIG. 14A. FIG. 14B is an equivalent circuit diagram. FIG. 14A illustrates a principal current ILL which flows while a low-side semiconductor device (switch) 13LT is turned on.

As illustrated in part (a) and part (d) of FIG. 14A, negative-electrode wiring conductors 12L are each surrounded by a bridge wiring conductor 12B with a clearance therebetween as viewed from a direction normal to the main surface of an insulating plate 16. The insulating chip 20 illustrated in FIG. 11, the negative-electrode wiring conductor 21L formed on the insulating chip 20, and the low-side terminal 17L' joined to the front side of the negative-electrode wiring conductor 21L are not present. An insulating wiring board 15 includes the insulating plate 16, wiring conductors (12B, 12H, 12L, 12HG, 12HS, 12LG, 12LS) arranged on the front surface of the insulating plate 16, and a thermal-strain alleviation conductor 22 arranged on the back surface of the insulating plate 16. The negative-electrode wiring conductors 12L are each provided at a region within the bridge wiring conductor 12B with a clearance therebetween. As illustrated in part (a) of FIG. 14A, a standing low-side terminal 14L' and the ends of a plurality of bonding wires 18LT on one side are connected to the negative-electrode wiring conductors 12L. The negative-electrode wiring conductors 12L are situated between the low-side terminal 14L' and the low-side power semiconductor device 13LT. The structure of the standing low-side terminal 14L' is similar to the low-side terminal 17L' in FIG. 11.

The positive-electrode wiring conductor 12H and the bridge wiring conductor 12B include protrusions 12HH and 12BB protruding into the other's region. The ends of a plurality of bonding wires 18BT (high-side connection means) on one side are connected to the protrusions 12BB, and a standing bridge terminal 14B' is connected to the protrusions 12HH by solder or the like. As illustrated in part (a) of FIG. 14A, the positional relation between a high-side power semiconductor device 13HT, a high-side terminal 14H', the bridge terminal 14B', the low-side terminal 14L', and the low-side power semiconductor device 13LT as viewed from the direction normal to the main surface of the insulating plate 16 is the same as the fourth embodiment (FIG. 11A).

Next, an example of the method of manufacturing the half-bridge power semiconductor module 5, illustrated in FIG. 14A and FIG. 14B, will be described with reference to FIG. 15. The manufacturing steps to be discussed here correspond to the manufacturing steps in the fourth embodiment, which have been described with reference to FIG. 12.

Figure 15:
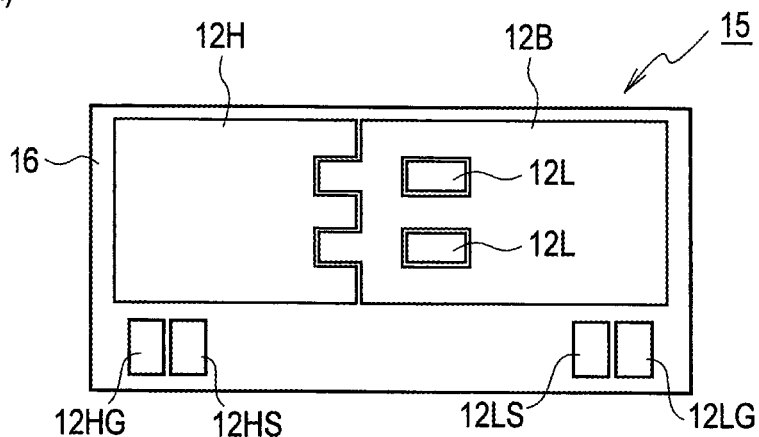
FIG. 15 Part (a) to part (c) of FIG. 15 are plan views illustrating an example of the method of manufacturing the half-bridge power semiconductor module 5 in FIG. 14A and FIG. 14B.
Figure 15:
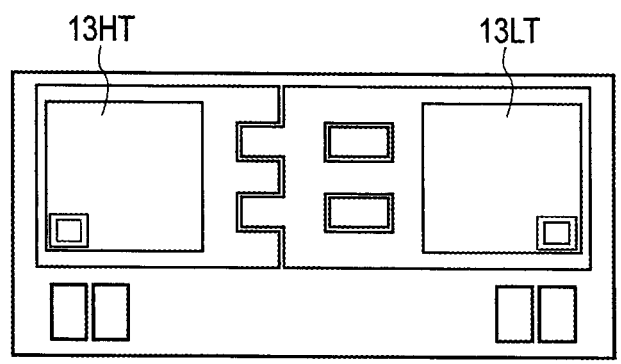
Figure 15:
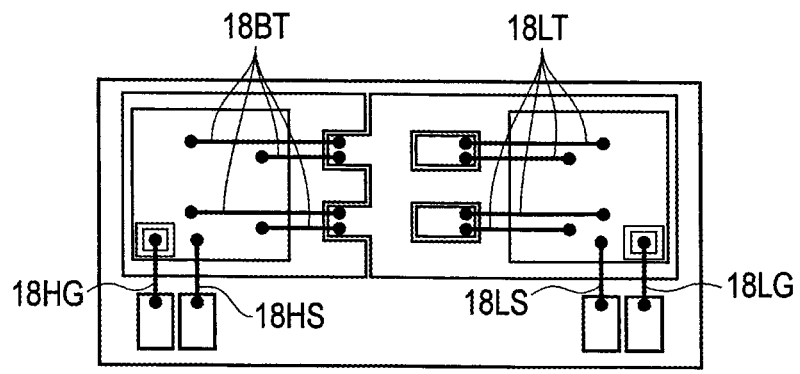

In the first step, as illustrated in part (a) of FIG. 15, the insulating wiring board 15 including the positive-electrode wiring conductor 12H, the bridge wiring conductor 12B, the negative-electrode wiring conductors 12L, the gate-signal wiring conductors (12HG, 12LG), and the source-signal wiring conductors (12HS, 12LS) is prepared. In addition, though not illustrated, the high-side power semiconductor device 13HT and the low-side power semiconductor device 13LT are prepared. The insulating wiring board 15 is thoroughly washed with an organic solvent such as acetone or ethanol.

Thereafter, in the second step, as illustrated in part (b) of FIG. 15, the back-surface electrodes of the power semiconductor devices (13HT, 13LT) are soldered to predetermined positions on the wiring conductors (12H, 12B) of the insulating wiring board 15 by using a vacuum reflow apparatus. In doing so, a carbon positioning jig is desirably used for accurate positioning of the power semiconductor devices (13HT, 13LT). Note that the joining method is not limited to soldering. It is also possible to use joining using an electrically conductive adhesive, joining using submicron particles of a conductor such as Ag or Cu, solid-phase (or liquid-phase) diffusion bonding, or the like.

In the next third step, as illustrated in part (c) of FIG. 15, the front-surface electrodes (source electrodes, gate electrodes) of the power semiconductor devices (13HT, 13LT) and the wiring conductors (12B, 12L, 12HG, 12HS, 12LG, 12LS) are connected with bonding wires (18BT, 18HG, 18HS, 18LT, 18LG, 18LS) by using a wire bonding apparatus. The connection means is not limited to bonding wires, and different connection means may be used.

Lastly in the fourth step, the standing terminals (14H', 14B', 14L', 14HG', 14HS', 14LG', 14LS') are soldered to predetermined positions on the front surfaces of the wiring conductors (12H, 12B, 12L, 12HG, 12HS, 12LG, 12LS) by using solder paste and a vacuum reflow apparatus. A carbon positioning jig is desirably used for accurate positioning. The solder used in the fourth step is desirably a material lower in melting point than the solder used in the second step by 30° C. or higher. Consequently, the half-bridge power semiconductor module 5, illustrated in FIG. 14A and FIG. 14B, is completed.

Figure 16:
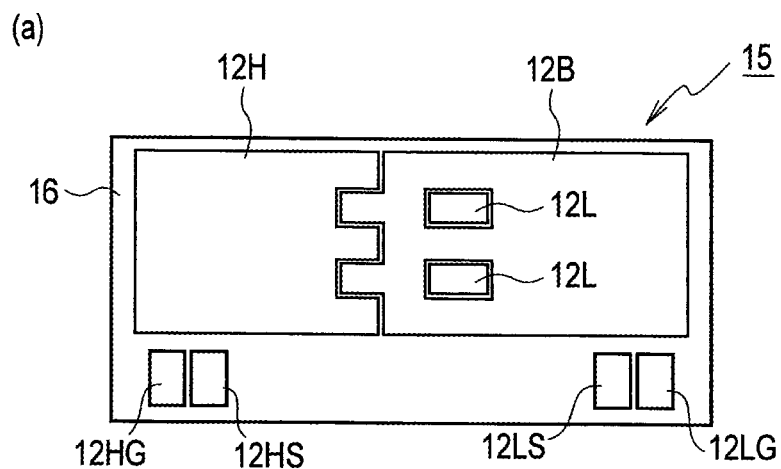
FIG. 16 Part (a) to part (c) of FIG. 16 are plan views illustrating another example of the method of manufacturing the half-bridge power semiconductor module 5 in FIG. 14A and FIG. 14B.
Figure 16:
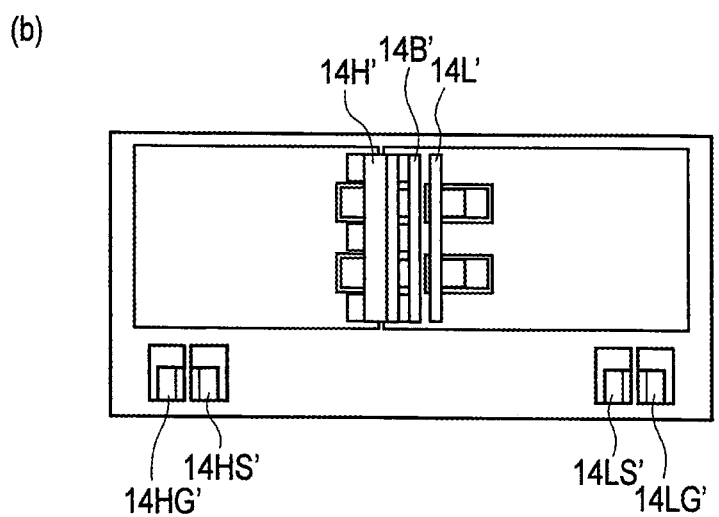
Figure 16:
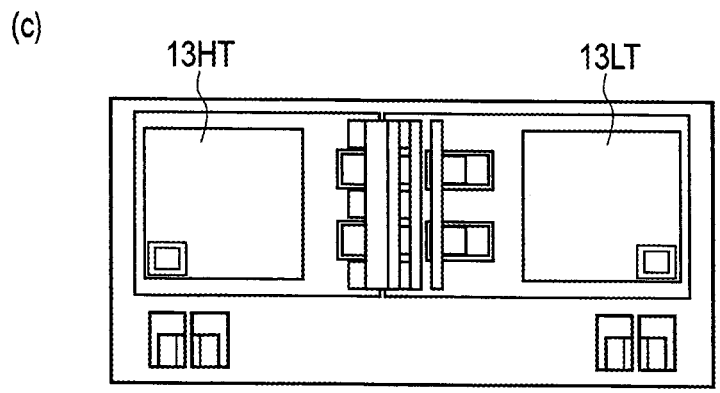

The half-bridge power semiconductor module 5, illustrated in FIG. 14A and FIG. 14B, can be manufactured alternatively by another manufacturing method illustrated in part (a) to part (c) of FIG. 16.

In the first step, as illustrated in part (a) of FIG. 16, the insulating wiring board 15 including the positive-electrode wiring conductor 12H, the bridge wiring conductor 12B, the negative-electrode wiring conductors 12L, the gate-signal wiring conductors (12HG, 12LG), and the source-signal wiring conductors (12HS, 12LS) is prepared. In addition, though not illustrated, the standing terminals (14H', 14B', 14L', 14HG', 14HS', 14LG', 14LS') are prepared. The insulating wiring board 15 is thoroughly washed with an organic solvent such as acetone or ethanol.

Thereafter, in the second step, as illustrated in part (b) of FIG. 16, the standing terminals (14H', 14B', 14L', 14HG', 14HS', 14LS', 14LS') are silver-brazed to predetermined positions on the front-surface wiring conductors 12H, 12B, 12L, 14HG, 14HS, 14LG, and 14LS of the insulating wiring board 15 by using a high-temperature joining apparatus. In doing so, a carbon positioning jig is desirably used for accurate positioning of the standing terminals. Note that the joining method is not limited to silver brazing. It is also possible to use soldering, joining using an electrically conductive adhesive, joining using submicron particles of a conductor such as Ag or Cu, solid-phase (or liquid-phase) diffusion bonding, or the like.

Thereafter, in the next third step, as illustrated in part (c) of FIG. 16, the power semiconductor devices (13HT, 13LT), thoroughly washed, are soldered to predetermined positions on the positive-electrode wiring conductor 12H and the bridge wiring conductor 12B by using a vacuum reflow apparatus. In doing so, a carbon positioning jig is desirably used for accurate positioning of the power semiconductor devices (13HT, 13LT). The joining method is not limited to soldering. It is also possible to use joining using an electrically conductive adhesive, joining using submicron particles of a conductor such as Ag or Cu, solid-phase (or liquid-phase) diffusion bonding, or the like. The material is desirably such that its process temperature for the joining is lower than the limit temperature of the joining material used in the second step by 30° C. or higher.

Lastly in the fourth step, the front-surface electrodes (source electrodes, gate electrodes) of the power semiconductor devices (13HT, 13LT) and the wiring conductors (12B, 12L, 12HG, 12HS, 12LG, 12LS) are connected with the bonding wires (18BT, 18HG, 18HS, 18LT, 18LG, 18LS) by using a wire bonding apparatus. The connection means is not limited to bonding wires, and different connection means may be used. Consequently, the half-bridge power semiconductor module 5, illustrated in FIG. 14A and FIG. 14B, is completed.

As is clear from part (b) and part (c) of FIG. 14A, the insulating wiring board 15 includes a single-layer insulating plate 16. Thus, the thermal resistance is lower than the comparative example in FIG. 21, and a thermal resistance as low as that of a conventional power semiconductor module is achieved.

Figure 17A:
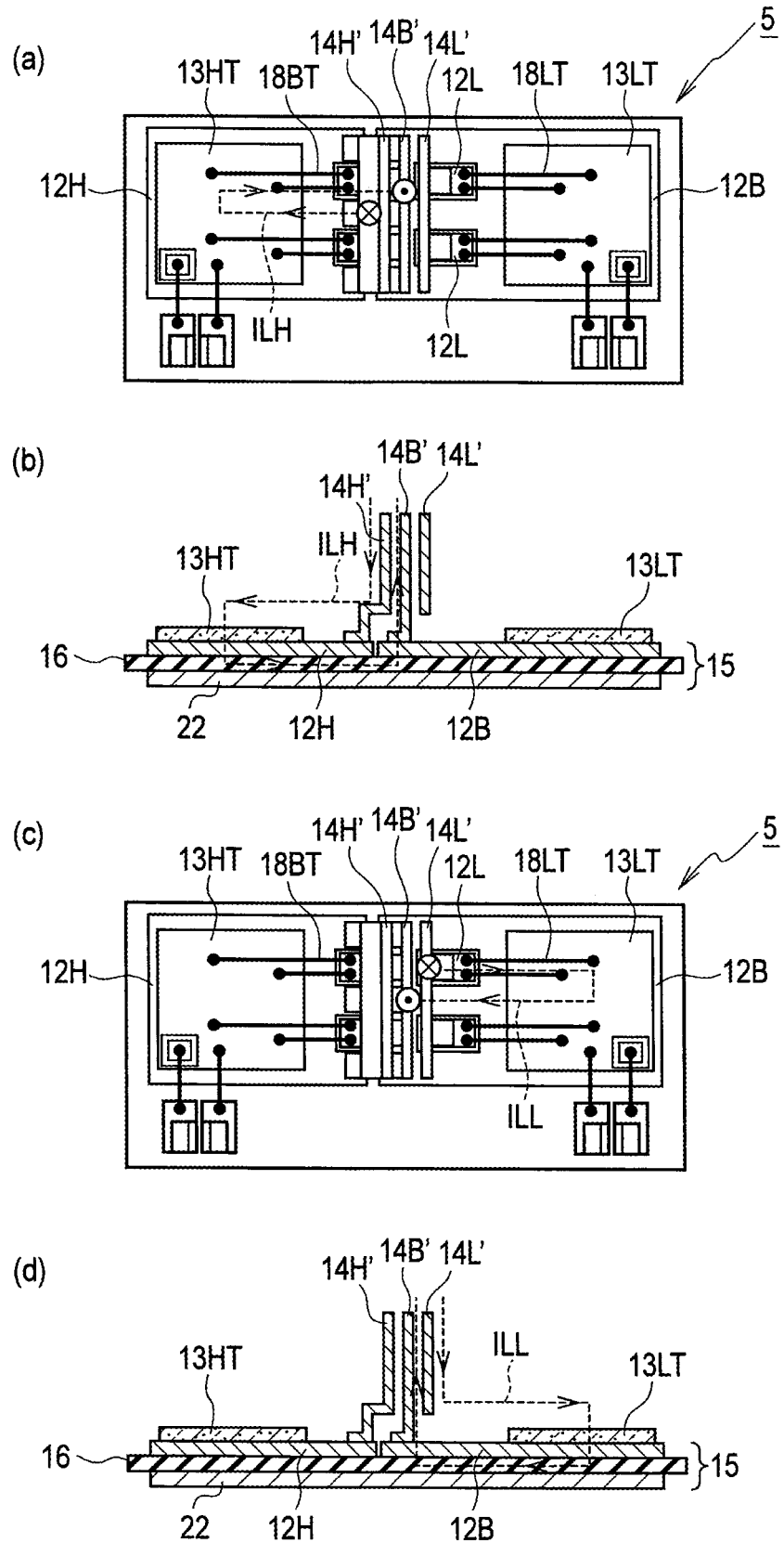
FIG. 17A Part (a) and part (b) of FIG. 17A illustrate a principal current ILH which flows while a high-side power semiconductor device (switch) 13HT in FIG. 14A is turned on, and part (c) and part (d) of FIG. 17A illustrate a principal current (loop current) ILL which flows through a diode in a low-side power semiconductor device (switch) 13LT in FIG. 14A.
Figure 17B:
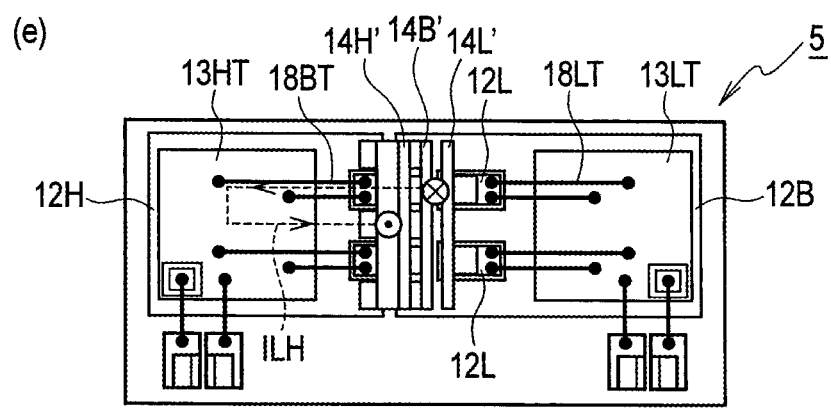
FIG. 17B Part (e) and part (f) of FIG. 17B illustrate a principal current (loop current) ILH which flows through a diode in the high-side power semiconductor device (switch) 13HT in FIG. 14A.
Figure 17B:
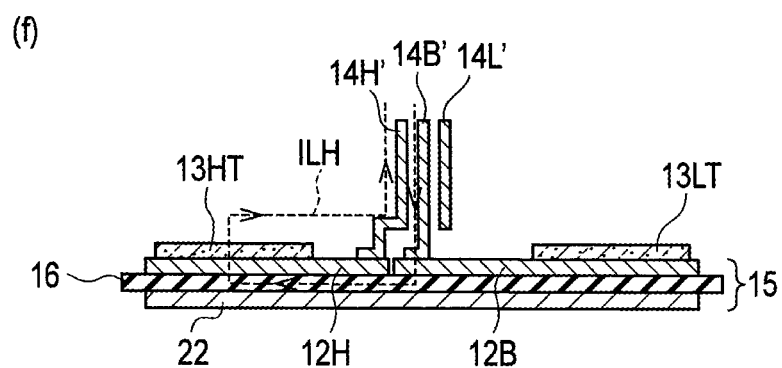

Part (a) of FIG. 14A, part (c) of FIG. 14A, FIG. 17A, and FIG. 17B illustrate all electric conduction modes of principal currents (load currents) ILH and ILL which flow in the half-bridge power semiconductor module 5. It can be seen that the principal currents (load currents) ILH and ILL generate close and parallel counterflows in all electric conduction modes.

The flow of a principal current ILL on the low side will now be reviewed in detail with the right-left direction and the up-down direction of plan views (art (a) of FIG. 14A, part (c) of FIG. 17A) defined as an x axis and a y axis, respectively, and the direction perpendicular to the surface of the sheet defined as a z axis. At a section covering the plurality of bonding wires 18LT and a section covering the standing terminals (14B', 14L'), the principal current ILL generates close and parallel counterflows in the xz plane (part (c) of FIG. 14A, part (d) of FIG. 17A), as in the fourth embodiment (FIG. 11A). Moreover, at a section covering the negative-electrode wiring conductors 12L, the principal current ILL generates close and parallel counterflows in the xy plane, unlike the fourth embodiment (FIG. 11A).

On the other hand, the flow of a principal current ILH on the high side is the same as the fourth embodiment (FIG. 11A) and generates close and parallel counterflows in the same manner as the fourth embodiment (FIG. 11).

Also, the flows of the principal currents (ILL, ILH) around the input-output terminals (14H', 14B', 17L') are the same as the fourth embodiment. Thus, as in the fourth embodiment, according to the fifth embodiment, the parasitic inductances around the input-output terminals can be smaller than the first to third embodiments and their modifications.

Sixth Embodiment

As mentioned in the second embodiment, one of the high-side power semiconductor device and the low-side power semiconductor device may be a power switching element, and the other may be a power diode. In a sixth embodiment, a half-bridge power semiconductor module 6 will be described which is obtained by replacing the low-side power semiconductor device (switch) 13LT in the half-bridge power semiconductor module 5 in the fifth embodiment with a high-speed freewheeling power diode 13LD.

Figure 18:
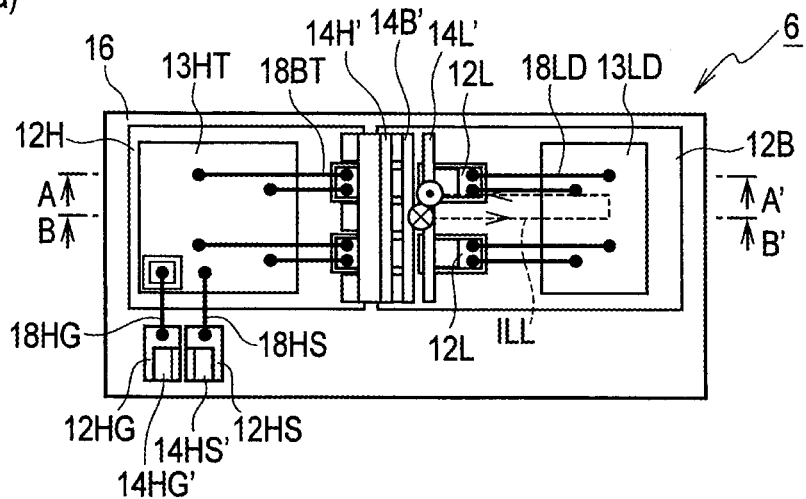
FIG. 18 Part (a) of FIG. 18 is a plan view illustrating the structure of a half-bridge power semiconductor module 6 according to a sixth embodiment, part (b) of FIG. 18 is a cross-sectional view taken along cross-sectional plane A-A' in part (a) of FIG. 18, part (c) of FIG. 18 is a cross-sectional view taken along cross-sectional plane B-B' in part (a) of FIG. 18.
Figure 18:
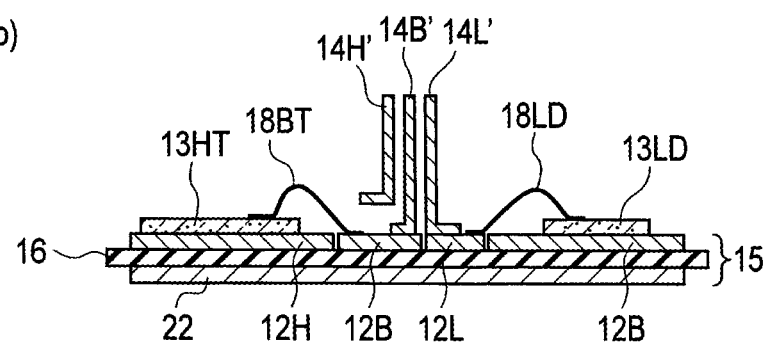
Figure 18:
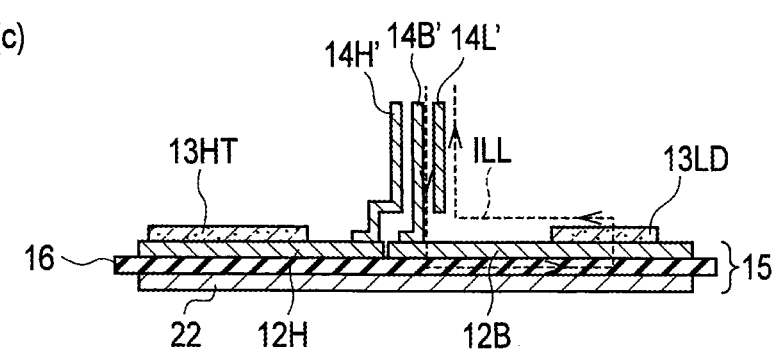

Part (a) of FIG. 18 is a plan view illustrating the structure of the half-bridge power semiconductor module 6 according to the sixth embodiment, part (b) of FIG. 18 is a cross-sectional view taken along cross-sectional plane A-A' in part (a) of FIG. 18, and part (c) of FIG. 18 is a cross-sectional view taken along cross-sectional plane B-B' in part (a) of FIG. 18. The half-bridge power semiconductor module 6 includes the high-speed freewheeling power diode 13LD arranged on the front surface of a bridge wiring conductor 12B as the low-side power semiconductor device. The back-surface electrode (cathode) of the high-speed freewheeling power diode 13LD is die-bonded to a predetermined position on the bridge wiring conductor 12B with solder or the like. The back front-surface electrode (anode) of the high-speed freewheeling power diode 13LD is connected to negative-electrode wiring conductors 12L by a plurality of bonding wires 18LD.

The half-bridge power semiconductor module 6 includes an insulating wiring board 15. The high-speed freewheeling power diode 13LD includes no gate electrode, and therefore the insulating wiring board 15 has the same configuration as the insulating wiring board 15 in part (a) of FIG. 1 except that there is no low-side gate-signal wiring conductor (12LG) or source-signal wiring conductor (12LS). In addition, there is no low-side bonding wire (18LG, 18LS) or standing terminal (14LG', 14LS') either.

The steps of manufacturing the half-bridge power semiconductor module 6, illustrated in FIG. 18, are the same as the steps of manufacturing the half-bridge power semiconductor module 5 described using FIG. 15 or FIG. 16, and description thereof will therefore be omitted.

The operation modes of the half-bridge power semiconductor module 6 are the same as the operation modes of the half-bridge power semiconductor module 5 illustrated in FIG. 17A and FIG. 17B. It is, however, assumed that the low-side power semiconductor device (switch) 13LT in FIG. 16 is replaced with the high-speed freewheeling power diode 13LD.

Since the basic configurations and the operation modes of various members are the same as the fifth embodiment (FIG. 14A), the sixth embodiment can also achieve the same operations and advantageous effects as the fifth embodiment.

Seventh Embodiment

As mentioned in the third embodiment, at least one of the high-side power semiconductor device and the low-side power semiconductor device may include a power switching element and a power diode connected in anti-parallel to the power switching element. In a seventh embodiment, a half-bridge power semiconductor module 7 will be described which is obtained by connecting a high-speed freewheeling power diode FWD in anti-parallel to the half-bridge power semiconductor module 5 in the fifth embodiment.

In the seventh embodiment, high-speed freewheeling power diodes FWD (13HD, 13LD) are connected in anti-parallel to a high-side power semiconductor device (switch) 13HT and a low-side power semiconductor device (switch) 13LT, respectively.

Figure 19:
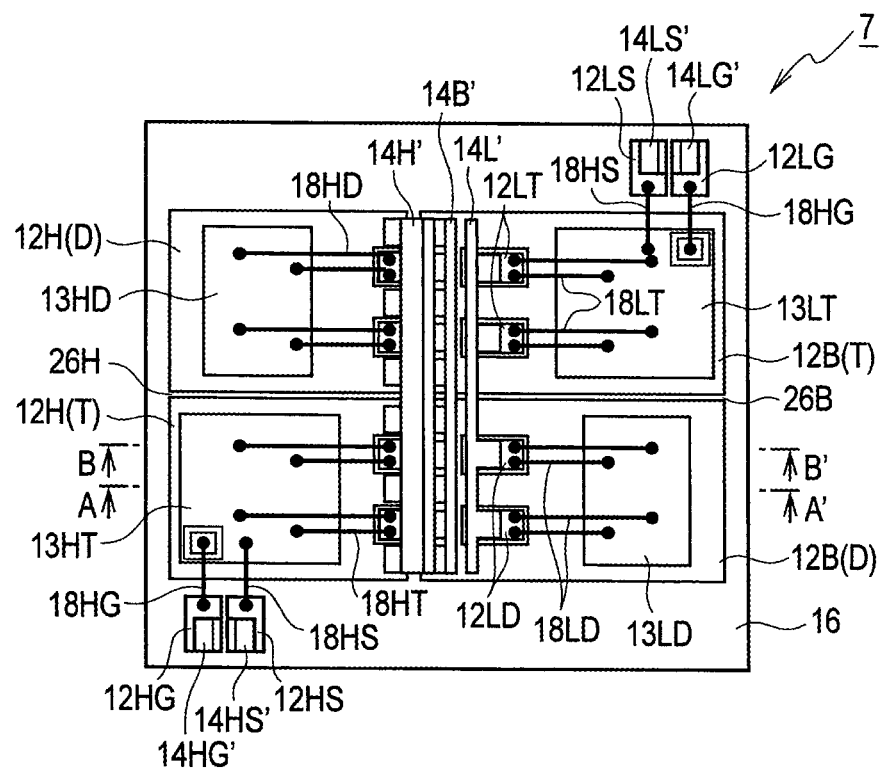
FIG. 19 is a plan view illustrating the structure of a half-bridge power semiconductor module 7 according to a seventh embodiment.

FIG. 19 is a plan view illustrating the structure of the half-bridge power semiconductor module 7 according to the seventh embodiment. A cross-sectional view taken along cross-sectional plane A-A' in FIG. 19 and a cross-sectional view taken along cross-sectional plane B-B' in FIG. 19 are the same as part (c) of FIG. 18 and part (b) of FIG. 18, and a circuit diagram thereof is the same as part (c) of FIG. 6. The same constituent elements as those in FIG. 6 and FIG. 18 will be denoted by the same reference signs, and description thereof will be omitted.

Negative-electrode wiring conductors 12LT are each surrounded by a bridge wiring conductor 12B(T) with a clearance therebetween as viewed from a direction normal to the main surface of an insulating plate 16. Negative-electrode wiring conductors 12LD are each surrounded by a bridge wiring conductor 12B(D) with a clearance therebetween as viewed from the direction normal to the main surface of the insulating plate 16. A low-side terminal 14L' which is a standing terminal is joined to the negative-electrode wiring conductors (12LT, 12LD). A plurality of bonding wires 18LT connect the negative-electrode wiring conductors 12LT and a front-surface electrode (source electrode or emitter electrode) of the low-side power semiconductor device (switch) 13LT. A plurality of bonding wires 18LD connect the negative-electrode wiring conductors 12LD and a front-surface electrode (anode) of the low-side power semiconductor device (diode) 13LD.

A standing bridge terminal 14B' is joined to the bridge wiring conductors 12B(T) and 12B(D) in such a way as to extend across the bridge wiring conductors 12B(T) and 12B(D). A standing high-side terminal 14H' is joined to the protruding regions of a positive-electrode wiring conductor 12H(T) and a positive-electrode wiring conductor 12H(D).

A plurality of bonding wires 18HT connect the protruding regions of the bridge wiring conductor 12B(D) and a front-surface electrode (source electrode or emitter electrode) of the high-side power semiconductor device (switch) 13HT. A plurality of bonding wires 18HD connect the protruding regions of the bridge wiring conductor 12B(T) and a front-surface electrode (anode) of the high-side power semiconductor device (diode) 13HD.

The steps of manufacturing the half-bridge power semiconductor module 7 according to the seventh embodiment are substantially the same as the manufacturing steps described using FIG. 15 or FIG. 16, and description thereof will therefore be omitted.

As in the sixth embodiment, the half-bridge power semiconductor module 7 according to the seventh embodiment includes an insulating wiring board 15 (FIG. 18) including a single-layer insulating plate 16. Hence, the thermal resistance is lower than the comparative example in FIG. 21, in which the insulating plate includes two layers, and a thermal resistance as low as a conventional power semiconductor module is achieved.

Figure 20A:
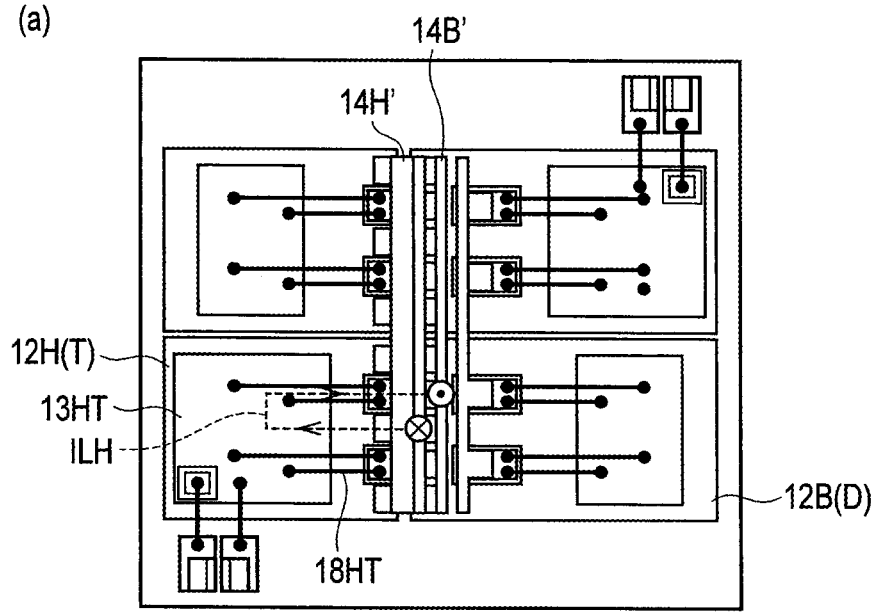
FIG. 20A Part (a) of FIG. 20A illustrates a principal current ILH which flows while a high-side power semiconductor device (switch) 13HT in FIG. 19 is turned on, and part (b) of FIG. 20A illustrates a principal current (loop current) ILL which flows through a low-side power semiconductor device (diode) 13LD in FIG. 19.
Figure 20A:
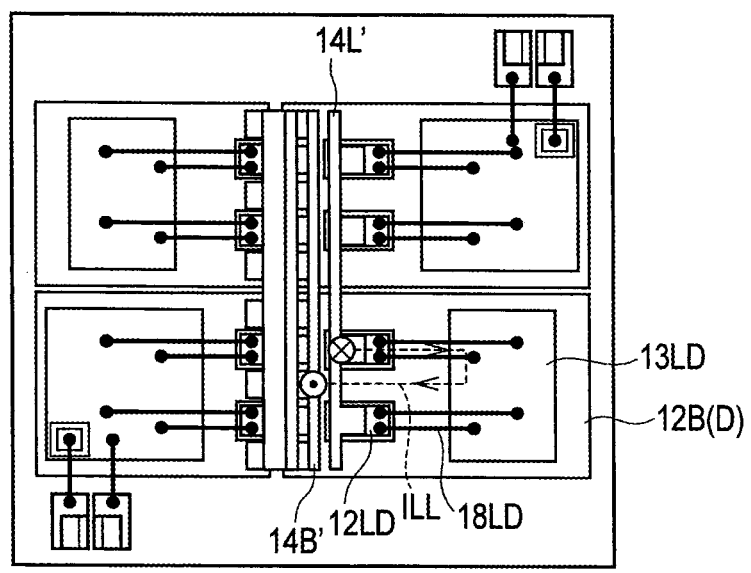
Figure 20B:
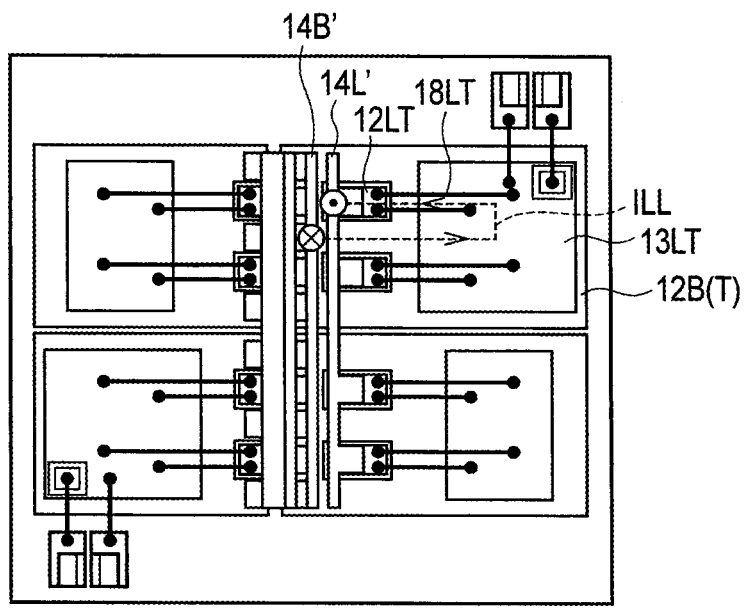
FIG. 20B Part (a) of FIG. 20B illustrates a principal current ILL which flows while a low-side power semiconductor device (switch) 13LT in FIG. 19 is turned on, and part (b) of FIG. 20B illustrates a principal current (loop current) ILL which flows through a high-side power semiconductor device (diode) 13HD in FIG. 19.
Figure 20B:
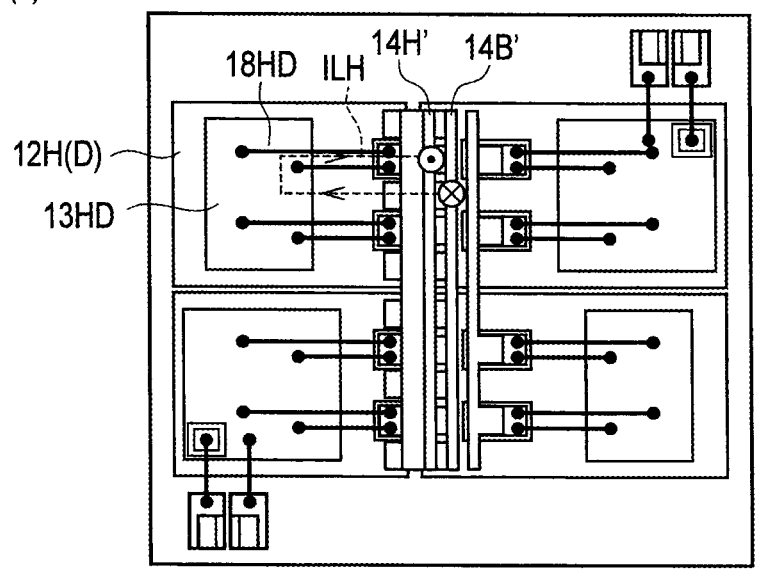

Part (a) of FIG. 20A illustrates a principal current ILH which flows while the high-side power semiconductor device (switch) 13HT in FIG. 19 is turned on, and part (b) of FIG. 20A illustrates a principal current (loop current) ILL which flows through the low-side power semiconductor device (diode) 13LD in FIG. 19. Part (a) of FIG. 20B illustrates a principal current ILL which flows while the low-side power semiconductor device (switch) 13LT in FIG. 19 is turned on, and part (b) of FIG. 20B illustrates a principal current (loop current) ILH which flows through the high-side power semiconductor device (diode) 13HD in FIG. 19. It can be seen that the principal currents ILH and ILL generate close and parallel counterflows in all operation modes of the half-bridge power semiconductor module 7, as illustrated in FIG. 20A and FIG. 20B.

Since the basic configurations and the operation modes of various members are the same as the third embodiment (FIG. 6) and the sixth embodiment (FIG. 18), the seventh embodiment can also achieve the same operations and advantageous effects as the third embodiment and the sixth embodiment.

The content of the present invention has been described above with embodiments. However, it is apparent to those skilled in the art that the present invention is not limited to the description of these embodiments but can be changed and modified in various ways.

REFERENCE SIGNS LIST 1 to 7, 1', 3-1, 3-2, 3-3 half-bridge power semiconductor module
12H, 12H(T), 12H(D) positive-electrode wiring conductor
12L, 12LT, 12LD, 21L negative-electrode wiring conductor
12B, 12B(T), 12B(D) bridge wiring conductor
12HG, 12LG gate(base)-signal wiring conductor
12HS, 12LS source(emitter)-signal wiring conductor
13HT high-side power semiconductor device (switch)
13HD high-side power semiconductor device (diode FWD)
13LT low-side power semiconductor device(switch)
13LD low-side power semiconductor device(diode FWD)
14H, 14H1, 14H2, 14H' high-side terminal
14L', 17L, 17L1, 17L2, 17L' low-side terminal
14B, 14B1, 14B2, 14B' bridge terminal
14HG, 14LG, 14HG', 14LG' gate-signal terminal
14HS, 14LS, 14HS', 14LS' source-signal terminal
15, 31 insulating wiring board
16 insulating plate
18BT, 18BD plurality of bonding wires (high-side connection means)
18LT, 18LD plurality of bonding wires (low-side connection means)
18HG, 18LG plurality of bonding wires (gate-signal connection means)
18HS, 18LS plurality of bonding wires (source-signal connection means)
20 insulating chip
25HB, 25LB snubber capacitor
ILH, ILL principal current

The invention claimed is:

1. A half-bridge power semiconductor module comprising:
an insulating wiring board including
an insulating plate having a single-layer structure, and having a front surface and a back surface, and
a positive-electrode wiring conductor, a bridge wiring conductor, and a negative-electrode wiring conductor arranged on or above the front surface of the insulating plate in such a way as to be electrically insulated from each other;
at least one high-side power semiconductor device with a back-surface electrode thereof joined to a front side of the positive-electrode wiring conductor;
at least one low-side power semiconductor device with a back-surface electrode thereof joined to a front side of the bridge wiring conductor;
a bridge terminal connected to the bridge wiring conductor between the high-side power semiconductor device and the low-side power semiconductor device;
a high-side terminal connected to the positive-electrode wiring conductor between the high-side power semiconductor device and the bridge terminal;
a low-side terminal connected to the negative-electrode wiring conductor between the bridge terminal and the low-side power semiconductor device;
high-side connection means for connecting a front-surface electrode of the high-side power semiconductor device and the bridge wiring conductor; and
low-side connection means for connecting a front-surface electrode of the low-side power semiconductor device and the negative-electrode wiring conductor,
the negative-electrode wiring conductor is surrounded by the bridge wiring conductor with a clearance therebetween as viewed from a direction normal to the front surface of the insulating plate.

2. The half-bridge power semiconductor module according to claim 1, wherein a principal current flowing through the positive-electrode wiring conductor and a principal current flowing through the high-side connection means are equal to each other in magnitude and are opposite and parallel to each other in direction.

3. The half-bridge power semiconductor module according to claim 1, wherein a principal current flowing through the bridge wiring conductor and a principal current flowing through the low-side connection means are equal to each other in magnitude and are opposite and parallel to each other in direction.

4. The half-bridge power semiconductor module according to claim 1, wherein the bridge terminal, the high-side terminal, and the low-side terminal are arranged close and parallel to each other.

5. The half-bridge power semiconductor module according to claim 1 wherein a principal current flowing through the high-side terminal and a principal current flowing through the bridge terminal are equal to each other in magnitude and are opposite and parallel to each other in direction.

6. The half-bridge power semiconductor module according to claim 1, wherein a principal current flowing through the low-side terminal and a principal current flowing through the bridge terminal are equal to each other in magnitude and are opposite and parallel to each other in direction.

7. The half-bridge power semiconductor module according to claim 1, wherein a direction of a principal current flowing through the positive-electrode wiring conductor and a direction of a principal current flowing through the high-side terminal are perpendicular to each other.

8. The half-bridge power semiconductor module according to claim 1, wherein a direction of a principal current flowing through the bridge wiring conductor and a direction of a principal current flowing through the low-side terminal are substantially perpendicular to each other.

9. The half-bridge power semiconductor module according to claim 1, wherein the insulating wiring board further includes a gate-signal wiring conductor and a source-signal wiring conductor arranged on the insulating plate, the half-bridge power semiconductor module further comprises a gate-signal terminal connected to the gate-signal wiring conductor, a source-signal terminal connected to the source-signal wiring conductor, gate-signal connection means for connecting the gate-signal wiring conductor and a gate electrode of at least one of the high-side power semiconductor device or the low-side power semiconductor device, and source-signal connection means for connecting the source-signal wiring conductor and a source electrode of the at least one of the high-side power semiconductor device or the low-side power semiconductor device, and the gate-signal connection means and the source-signal connection means are arranged in parallel to each other and the gate-signal terminal and the source-signal terminal are arranged in parallel to each other.

10. The half-bridge power semiconductor module according to claim 1, further comprising at least one of:

a high-side snubber capacitor connected between the high-side terminal and the bridge terminal at a front surface of the insulating plate; or a low-side snubber capacitor connected between the bridge terminal and the low-side terminal at the front surface of the insulating plate.

11. The half-bridge power semiconductor module according to claim 1, wherein one of the high-side power semiconductor device or the low-side power semiconductor device is a power switching element, and the other is a power diode.

12. The half-bridge power semiconductor module according to claim 1, wherein at least one of the high-side power semiconductor device or the low-side power semiconductor device includes a power switching element and a power diode connected in anti-parallel to the power switching element.

13. The half-bridge power semiconductor module according to claim 12, wherein in at least one of the positive-electrode wiring conductor or the bridge wiring conductor, a slit is formed as a partition between the power switching element and the power diode.

14. The half-bridge power semiconductor module according to claim 12, wherein two or more of the high-side power semiconductor devices are aligned in one direction in such a way as to share a flow path for principal currents flowing through each of the positive-electrode wiring conductor and the high-side connection means.

15. The half-bridge power semiconductor module according to claim 12, wherein two or more of the low-side power semiconductor devices are aligned in one direction in such a way as to share a flow path for principal currents flowing through each of the bridge wiring conductor and the low-side connection means.

16. The half-bridge power semiconductor module according to claim 1, wherein the high-side terminal, the bridge terminal, and the low-side terminal are flat plate-shaped terminals standing from portions thereof connected to the positive-electrode wiring conductor, the bridge wiring conductor, and the negative-electrode wiring conductor, respectively, in a direction normal to the front surface of the insulating plate.

17. The half-bridge power semiconductor module according to claim 16, wherein the high-side terminal, the bridge terminal, and the low-side terminal are parallel to each other.

18. The half-bridge power semiconductor module according to claim 16, wherein the high-side terminal and the low-side terminal each include a flat plate-shaped base portion standing in the direction normal to the front surface of the insulating plate, and a plurality of tooth portions branching from the base portion, and tips of the plurality of tooth portions are connected to the corresponding one of the positive-electrode wiring conductor or the negative-electrode wiring conductor.

19. The half-bridge power semiconductor module according to claim 9, wherein the gate-signal terminal and the source-signal terminal are flat plate-shaped terminals standing from the gate-signal wiring conductor and the source-signal wiring conductor, respectively, in a direction normal to the front surface of the insulating plate.

20. The half-bridge power semiconductor module according to claim 19, wherein the gate-signal terminal and the source-signal terminal are parallel to each other.

21. A method of manufacturing a half-bridge power semiconductor module including an insulating wiring board including an insulating plate having a single-layer structure, and having a front surface and a back surface, and a positive-electrode wiring conductor, a bridge wiring conductor, and a negative-electrode wiring conductor arranged on or above the front surface of the insulating plate in such a way as to be electrically insulated from each other, at least one high-side power semiconductor device with a back-surface electrode thereof joined to a front side of the positive-electrode wiring conductor, at least one low-side power semiconductor device with a back-surface electrode thereof joined to a front side of the bridge wiring conductor, a bridge terminal connected to the bridge wiring conductor between the high-side power semiconductor device and the low-side power semiconductor device, a high-side terminal connected to the positive-electrode wiring conductor between the high-side power semiconductor device and the bridge terminal, a low-side terminal connected to the negative-electrode wiring conductor between the bridge terminal and the low-side power semiconductor device, high-side connection means for connecting a front-surface electrode of the high-side power semiconductor device and the bridge wiring conductor, and low-side connection means for connecting a front-surface electrode of the low-side power semiconductor device and the negative-electrode wiring conductor, the negative-electrode wiring conductor being surrounded by the bridge wiring conductor with a clearance therebetween as viewed from a direction normal to the front surface of the insulating plate, the high-side terminal, the bridge terminal, and the low-side terminal being flat plate-shaped terminals standing from portions thereof connected to the positive-electrode wiring conductor, the bridge wiring conductor, and the negative-electrode wiring conductor, respectively, in the direction normal to the front surface of the insulating plate, the method comprising:

preparing the insulating wiring board, which includes the positive-electrode wiring conductor, the bridge wiring conductor, and the negative-electrode wiring conductor, the high-side power semiconductor device, and the low-side power semiconductor device;

joining the back-surface electrode of the high-side power semiconductor device to the front side of the positive-electrode wiring conductor;

joining the back-surface electrode of the low-side power semiconductor device to the front side of the bridge wiring conductor;

connecting the front-surface electrode of the high-side power semiconductor device and the bridge wiring conductor by using the high-side connection means;

connecting the front-surface electrode of the low-side power semiconductor device and the negative-electrode wiring conductor by using the low-side connection means;

connecting the bridge terminal to the bridge wiring conductor;

connecting the high-side terminal to the positive-electrode wiring conductor; and connecting the low-side terminal to the negative-electrode wiring conductor.

22. A half-bridge power semiconductor module comprising:

an insulating wiring board including an insulating plate having a single-layer structure, and having a front surface and a back surface, and a positive-electrode wiring conductor, a bridge wiring conductor, and a negative-electrode wiring conductor arranged on or above the front surface of the insulating plate in such a way as to be electrically insulated from each other;

at least one high-side power semiconductor device with a back-surface electrode thereof joined to a front side of the positive-electrode wiring conductor;

at least one low-side power semiconductor device with a back-surface electrode thereof joined to a front side of the bridge wiring conductor;

a bridge terminal connected to the bridge wiring conductor between the high-side power semiconductor device and the low-side power semiconductor device;

a high-side terminal connected to the positive-electrode wiring conductor between the high-side power semiconductor device and the bridge terminal;

a low-side terminal connected to the negative-electrode wiring conductor between the bridge terminal and the low-side power semiconductor device;

high-side wires connecting a front-surface electrode of the high-side power semiconductor device and the bridge wiring conductor; and low-side wires for connecting a front-surface electrode of the low-side power semiconductor device and the negative-electrode wiring conductor, the negative-electrode wiring conductor is surrounded by the bridge wiring conductor with a clearance therebetween as viewed from a direction normal to the front surface of the insulating plate.

* * * * *